United States Patent
Asano et al.

(10) Patent No.: US 8,530,931 B2
(45) Date of Patent: Sep. 10, 2013

(54) SEMICONDUCTOR DEVICE AND METHOD OF MANUFACTURING THE SAME

(75) Inventors: Masayoshi Asano, Yokohama (JP); Junichi Mitani, Yokohama (JP)

(73) Assignee: Fujitsu Semiconductor Limited, Yokohama (JP)

(*) Notice: Subject to any disclaimer, the term of this patent is extended or adjusted under 35 U.S.C. 154(b) by 95 days.

(21) Appl. No.: 13/301,698

(22) Filed: Nov. 21, 2011

(65) Prior Publication Data

US 2012/0193711 A1 Aug. 2, 2012

(30) Foreign Application Priority Data

Jan. 31, 2011 (JP) ................................. 2011-017611

(51) Int. Cl.
*H01L 29/66* (2006.01)

(52) U.S. Cl.
USPC ............... 257/173; 257/355; 257/E29.125; 438/135

(58) Field of Classification Search
None
See application file for complete search history.

(56) References Cited

U.S. PATENT DOCUMENTS

| | | | |
|---|---|---|---|
| 5,903,032 A | 5/1999 | Duvvury | |
| 6,144,070 A | 11/2000 | Devore et al. | |
| 6,605,844 B2 | 8/2003 | Nakamura et al. | |
| 6,614,077 B2 | 9/2003 | Nakamura et al. | |
| 7,414,287 B2 | 8/2008 | Pendharkar et al. | |
| 7,838,940 B2 * | 11/2010 | Schneider et al. | 257/355 |
| 8,344,416 B2 * | 1/2013 | Sheu et al. | 257/170 |
| 2008/0023767 A1 * | 1/2008 | Voldman | 257/355 |
| 2012/0119292 A1 * | 5/2012 | Katayama et al. | 257/335 |

FOREIGN PATENT DOCUMENTS

| | | |
|---|---|---|
| JP | 2001-320047 A | 11/2001 |
| JP | 2002-94063 A | 3/2002 |

OTHER PUBLICATIONS

Pendharkar et al., "SCR-LDMOS—A Novel LDMOS Device With ESD Robustness," 12$^{th}$ International Symposium on Power Semiconductor Devices and IC S. ISPSD 2000 Proceedings, May 22, 2000, pp. 341-344, XP000987883.
Griffoni et al., "Charged Device Model (CDM) ESD Challenges for Laterally Diffused nMOS (nLDMOS) Silicon Controlled Rectifier (SCR) Devices for High-Voltage Applications in Standard Low-Voltage CMOS Technology," Electron Devices Meeting (IEDM), IEEE International, Dec. 6, 2010, pp. 35.5.1-35.5.4, XP031885096.
Zhang et al., "Analysis of LDMOS-SCR ESD Protection Device for 60V SOI BCD Technology," 2010 IEEE International Conference of Electron Devices and Solid-State Circuits (EDSSC), Dec. 15, 2010, pp. 1-4, XP031978997.
Walker et al., "Novel Robust High Voltage ESD Clamps for LDMOS Protection," IEEE 45$^{th}$ Annual International Reliability Physics Symposium, Apr. 1, 2007, pp. 596-597, XP031175150.

(Continued)

*Primary Examiner* — Benjamin Sandvik
(74) *Attorney, Agent, or Firm* — Fujitsu Patent Center

(57) ABSTRACT

A gate electrode, an element isolation film and a drain region in an LDMOS transistor formation region and a gate electrode, an element isolation film and an anode region in an ESD protection element formation region are formed to satisfy relationships of A1≧A2 and B1<B2 where the LDMOS transistor formation region has an overlap length A1 of the gate electrode and the element isolation film and a distance B1 between the gate electrode and the drain region, and the ESD protection element formation region has an overlap length A2 of the gate electrode and the element isolation film and a distance B2 between the gate electrode and the anode region.

10 Claims, 20 Drawing Sheets

(56) References Cited

OTHER PUBLICATIONS

Zhang et al., "Study of LDMOS-SCR: A High Voltage ESD Protection Device," Solid-State and Integrated Circuit Technology (ICSICT), 2010 10$^{th}$ IEEE International Conference, Nov. 1, 2010, pp. 1722-1724, XP031834959.

Extended European Search Report dated Mar. 26, 2012 for corresponding European Application No. 11189873.0.

* cited by examiner

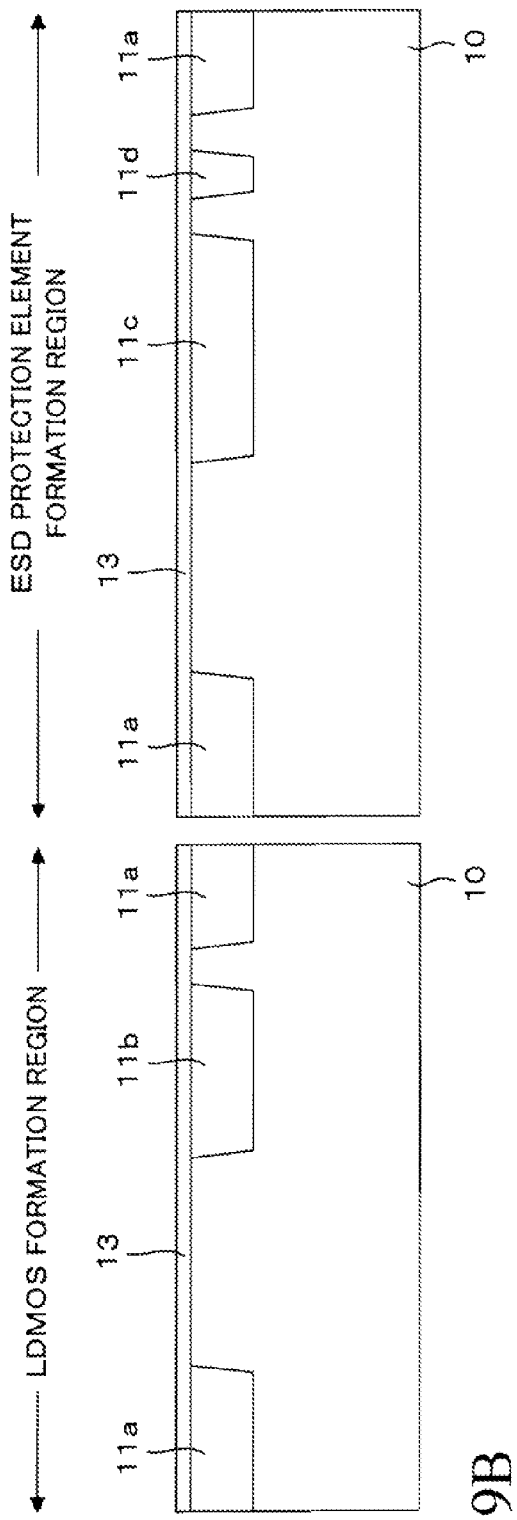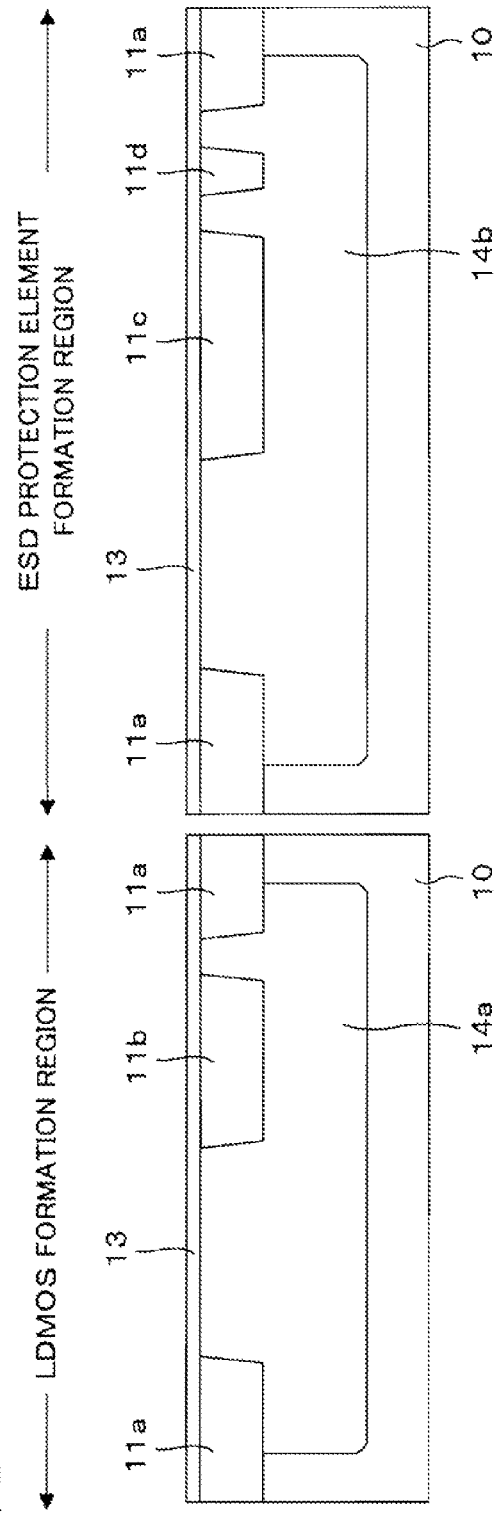

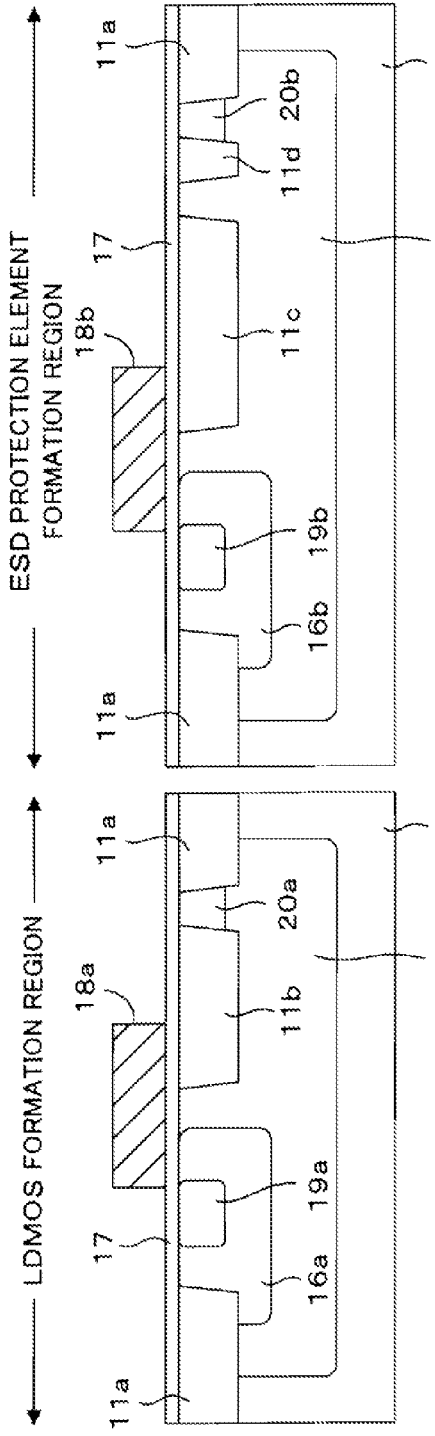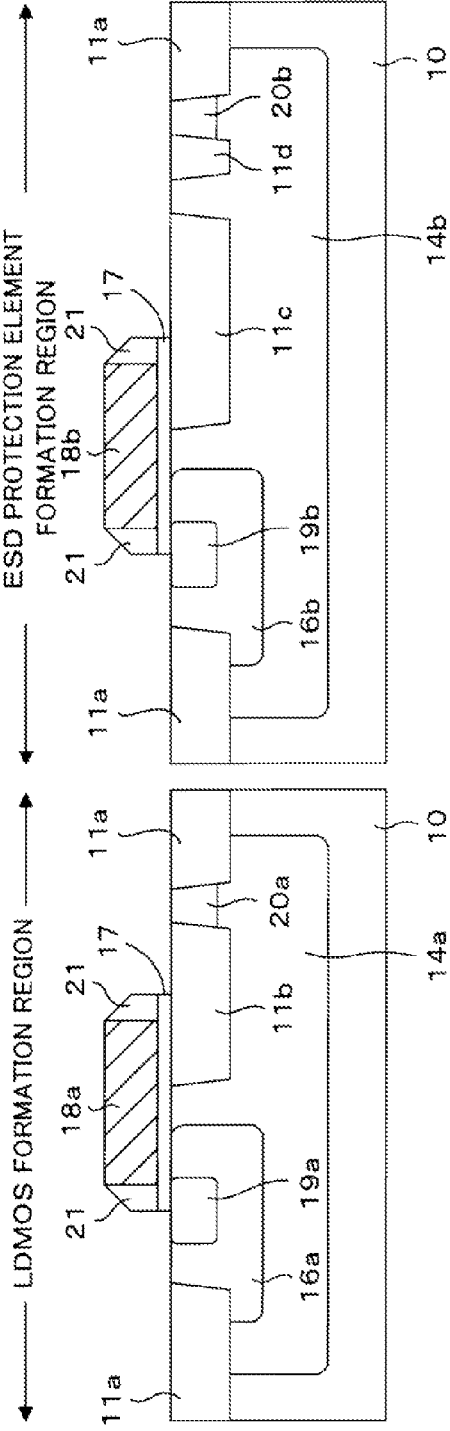

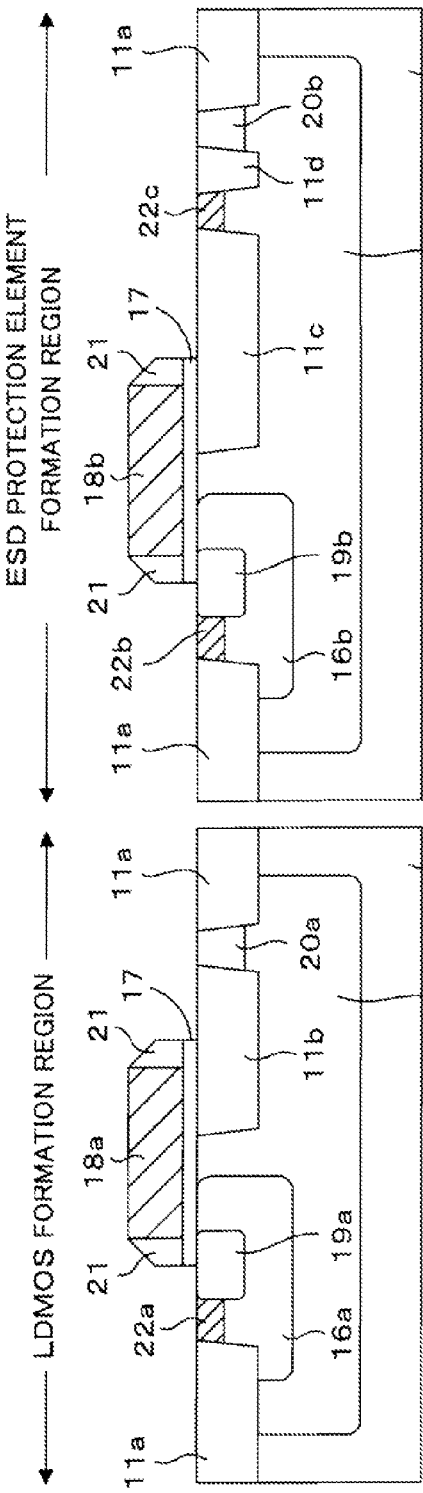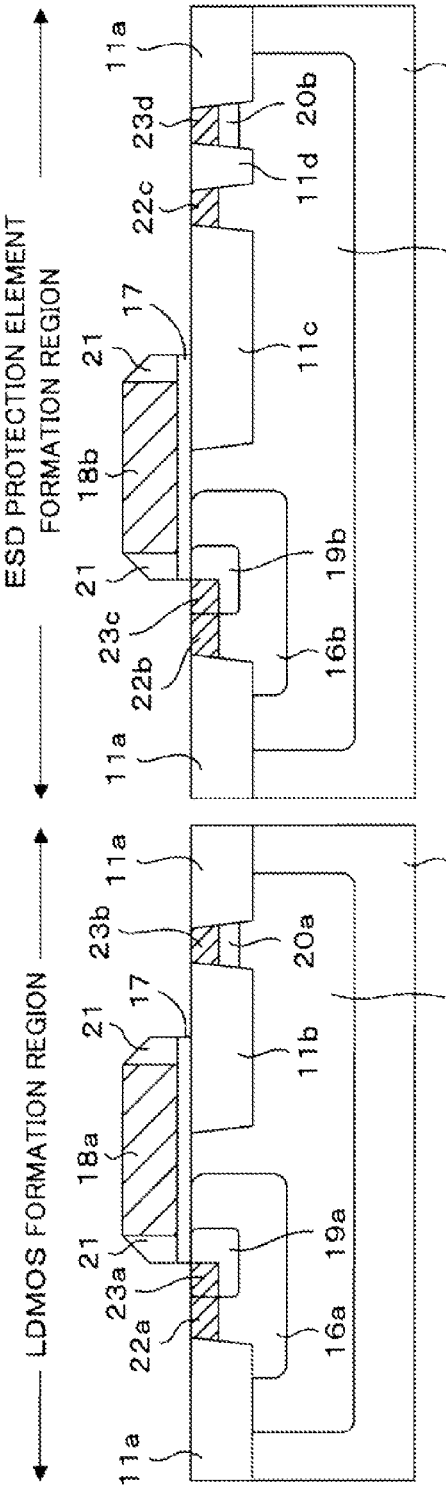

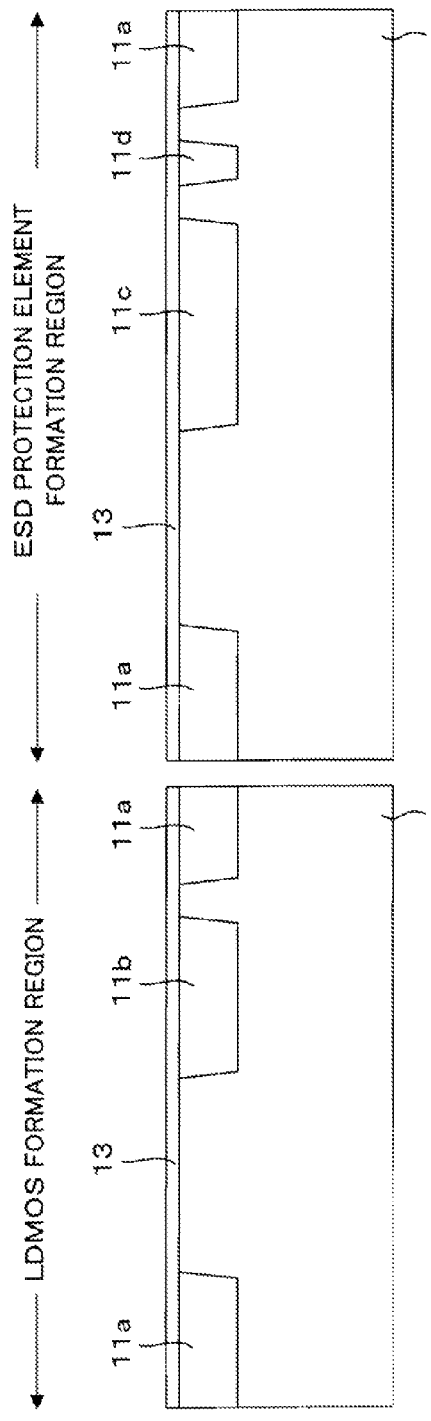
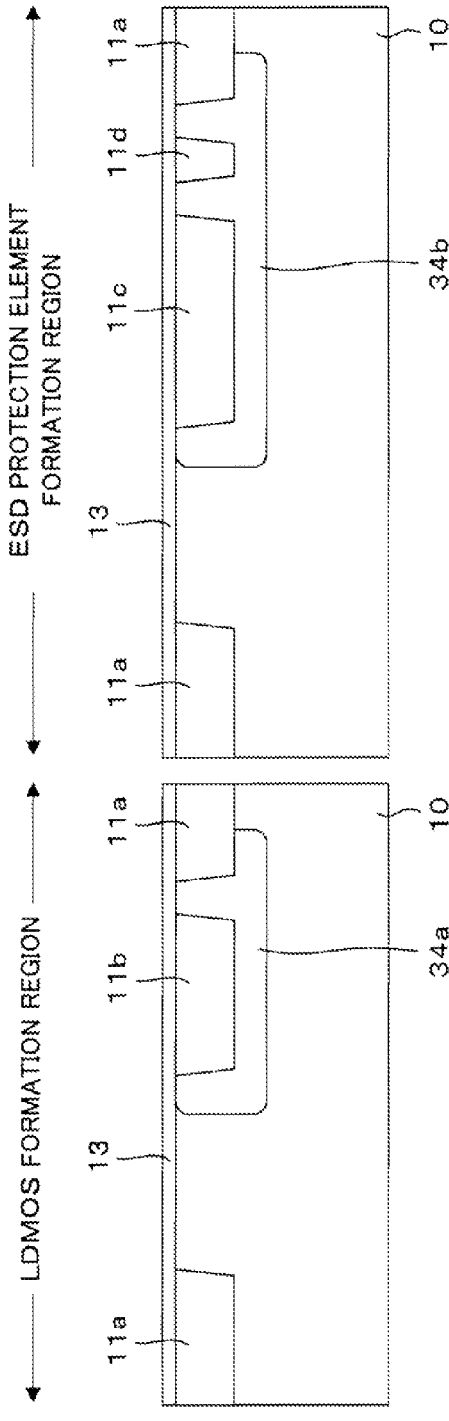

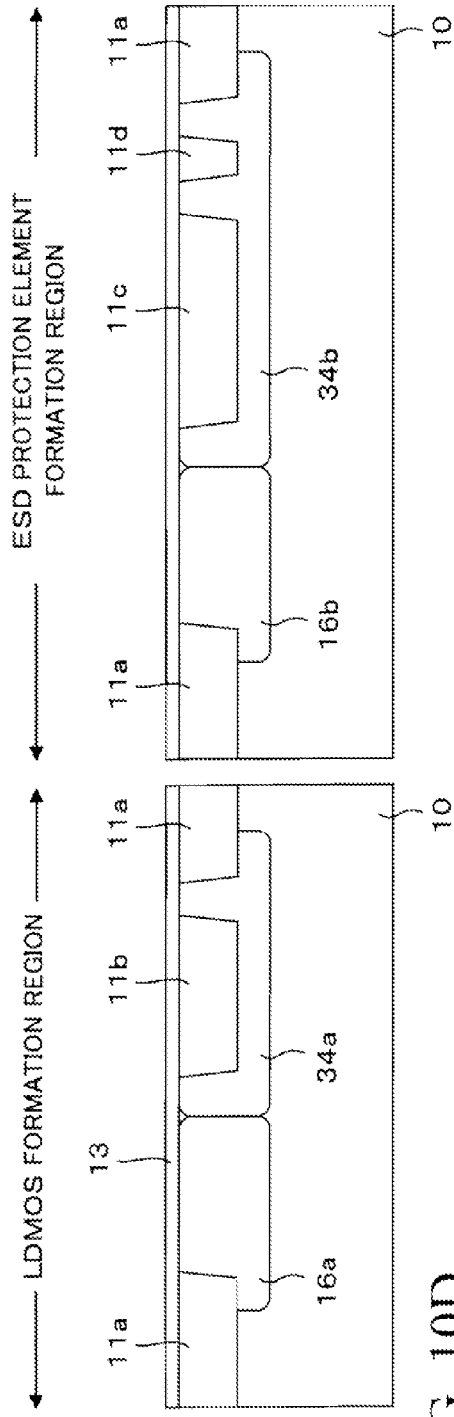
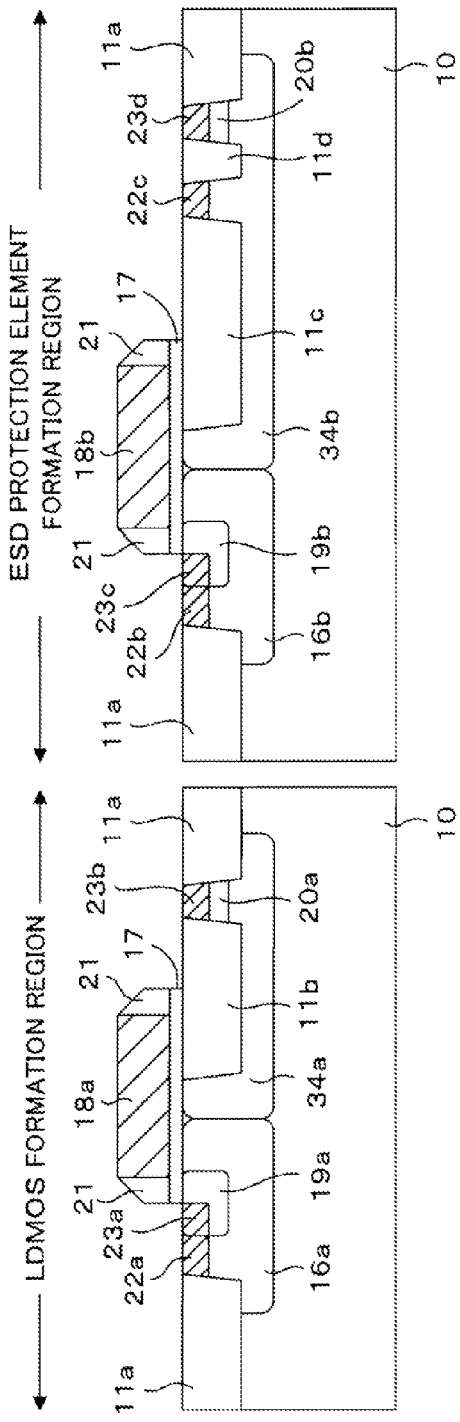
FIG. 10C
FIG. 10D

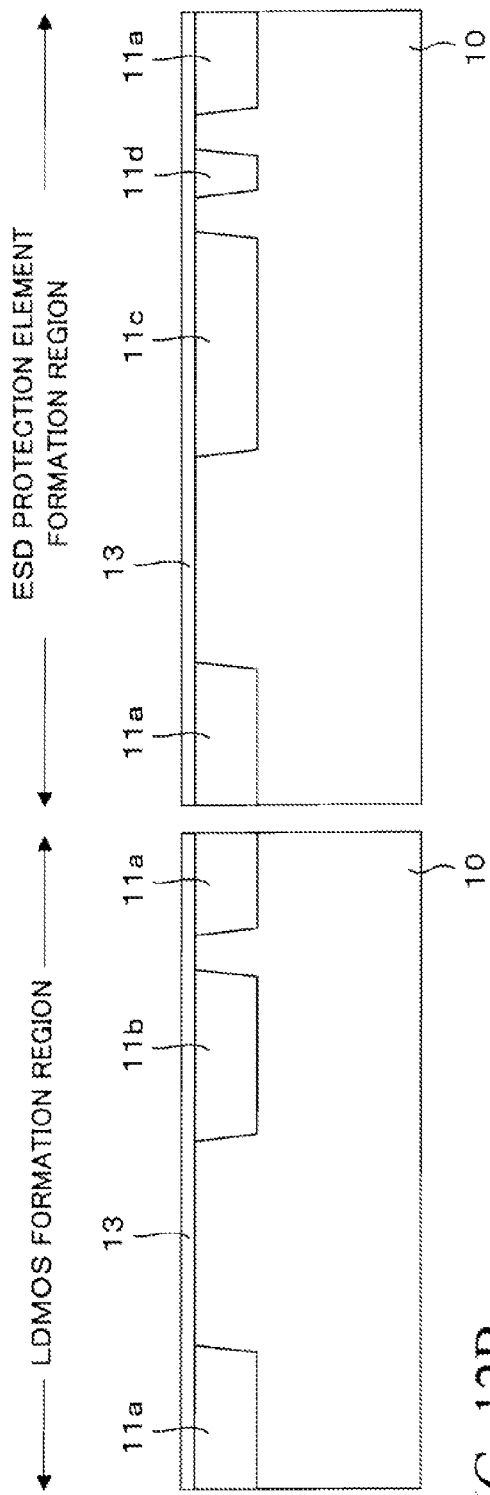
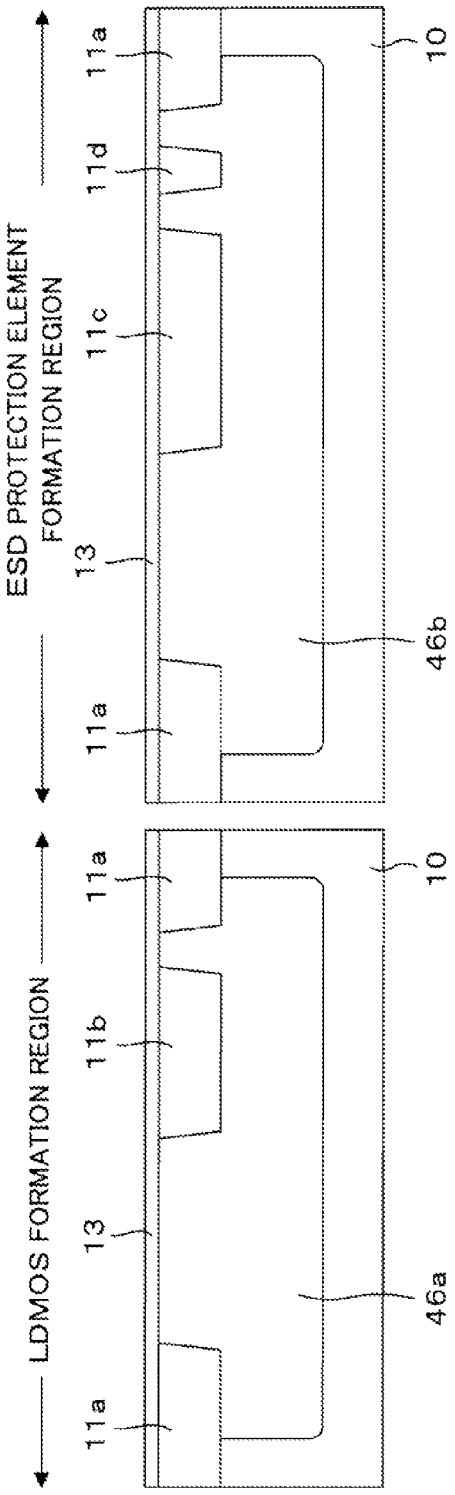

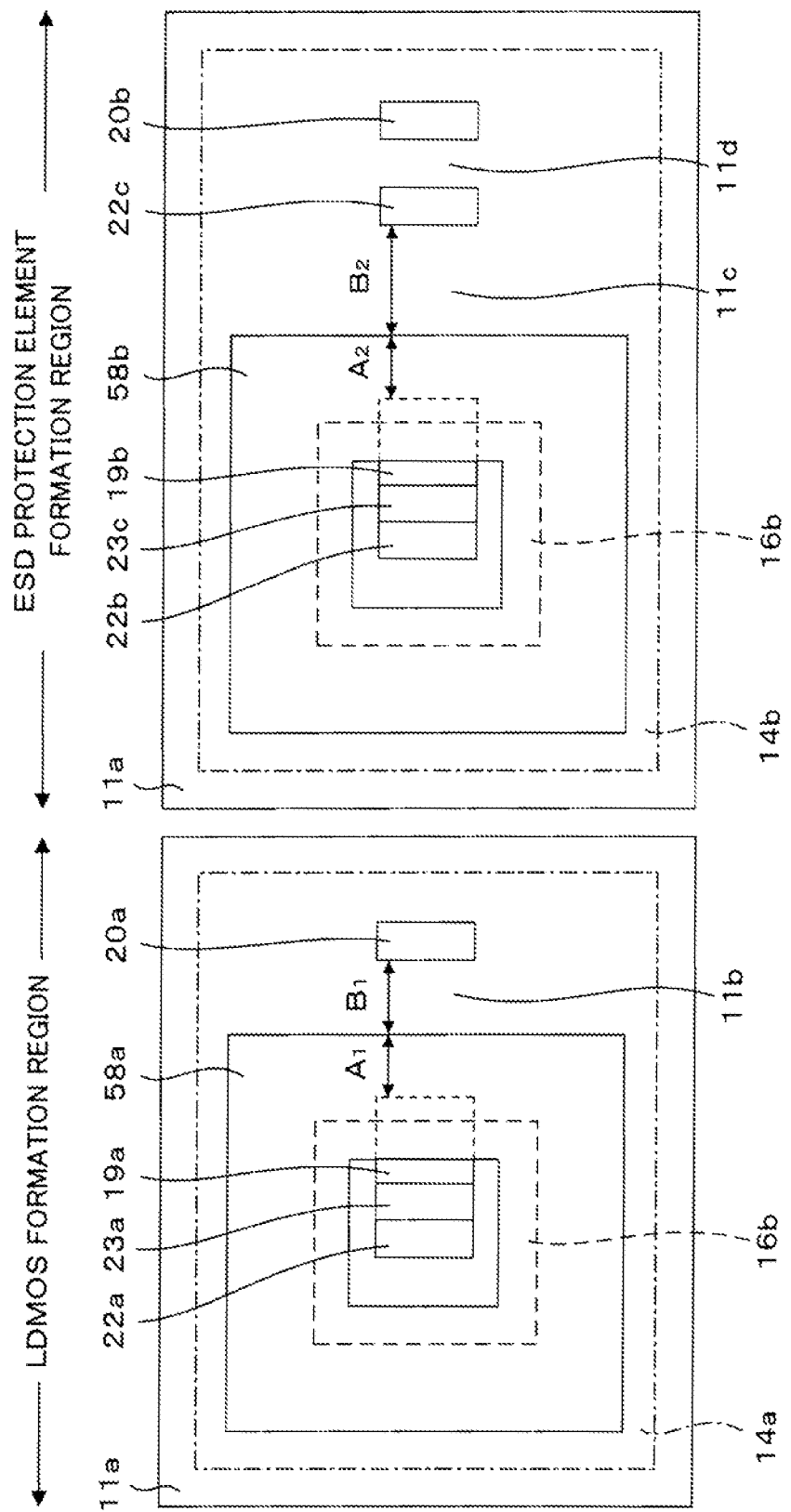

SEMICONDUCTOR DEVICE AND METHOD OF MANUFACTURING THE SAME

CROSS-REFERENCE TO RELATED APPLICATIONS

This application is based upon and claims and the benefit of priority of the prior Japanese Patent Application No. 2011-017611, filed on Jan. 31, 2011, the entire contents of which are incorporated herein by reference.

FIELD

The embodiments discussed herein relate to a semiconductor device including a laterally diffused metal oxide semiconductor (LDMOS) transistor and an electrostatic discharge (ESD) protection element, and a method of manufacturing the semiconductor device.

BACKGROUND

Heretofore, compound semiconductor elements have been mainly used to process signals at high frequency band (microwave band). In recent years, however, laterally diffused metal oxide semiconductor (LDMOS) transistors formed in semiconductor substrates have been used instead of these compound semiconductor elements. The LDMOS transistors are advantageous in that the LDMOS transistors can be fabricated at lower costs than the compound semiconductor elements. In addition, the LDMOS transistors are also advantageous in that the breakdown voltage thereof can be enhanced relatively easily. Semiconductor devices (integrated circuits) each internally including an LDMOS transistor are widely used in mobile phones, wireless LAN equipment, in-vehicle electronic devices, and the like.

In addition, there are many semiconductor devices each including an electrostatic discharge (ESD) protection element in a chip to prevent an electrostatic breakdown of the device. There are also developed thyristor-type ESD protection elements achieving high discharge performance with almost the same structure as LDMOS transistors.

Patent Document 1: U.S. Pat. No. 5,903,032
Patent Document 2: U.S. Pat. No. 6,144,070
Patent Document 3: Japanese Laid-open Patent Application Publication No. 2001-320047
Patent Document 4: Japanese Laid-open Patent Application Publication No. 2002-94063

SUMMARY

According to an aspect of the disclosed technology, there is provided a semiconductor device including a LDMOS (Laterally Diffused MOS) transistor and an ESD (Electrostatic Discharge) protection element. The LDMOS transistor includes: a first gate electrode formed on the semiconductor substrate with an insulating film interposed therebetween; a first body region formed by implanting impurities of a first conductivity type into the semiconductor substrate and disposed at one edge side of the first gate electrode; a first source region of a second conductivity type disposed in an upper portion of the first body region; a first element isolation film formed in an upper portion of the semiconductor substrate and disposed to overlap the first gate electrode; a first drain region formed inside the semiconductor substrate, including impurities of the second conductivity type, and disposed at a position in contact with an edge portion of the first element isolation film and away from the first gate electrode; and a first drift region formed inside the semiconductor substrate, including impurities of the second conductivity type, and being in contact with the first body region and the first drain region. Meanwhile, the ESD protection element includes: a second gate electrode formed on the semiconductor substrate with an insulating film interposed therebetween; a second body region formed inside the semiconductor substrate, including impurities of the first conductivity type, and disposed at one edge side of the second gate electrode; a second source region of the second conductivity type disposed in an upper portion of the second body region; a second element isolation film formed in an upper portion of the semiconductor substrate and disposed to overlap the second gate electrode; an anode region formed inside the semiconductor substrate, including impurities of the first conductivity type, and disposed at a position in contact with an edge portion of the second element isolation film and away from the second gate electrode; a third element isolation film formed in an upper portion of the semiconductor substrate and disposed adjacent to the anode region; a second drain region formed inside the semiconductor substrate, including impurities of the second conductivity type, and being in contact with the third element isolation film; and a second drift region formed inside the semiconductor substrate, including impurities of the second conductivity type, and being in contact with the second body region, the anode region and the second drain region. The semiconductor device has relationships of $A1 \geq A2$ and $B1 < B2$ where $A1$ denotes an overlap length of the first gate electrode and the first element isolation film; $A2$ denotes an overlap length of the second gate electrode and the second element isolation film; $B1$ denotes a distance between the first gate electrode and the first drain region; and $B2$ denotes a distance between the second gate electrode and the anode region.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 9A to 9I are cross sectional views illustrating a method of manufacturing the semiconductor device of the first embodiment;

FIGS. 10A to 10D are cross sectional views illustrating a method of manufacturing a semiconductor device of a second embodiment;

FIGS. 12A to 12D are cross sectional views illustrating a method of manufacturing a semiconductor device of a third embodiment;

FIG. 15 is a top view of the semiconductor device of the fourth embodiment.

DESCRIPTION OF EMBODIMENTS

Hereinafter, embodiments will be described by referring to the accompanying drawings.

First Embodiment

Figure 1:
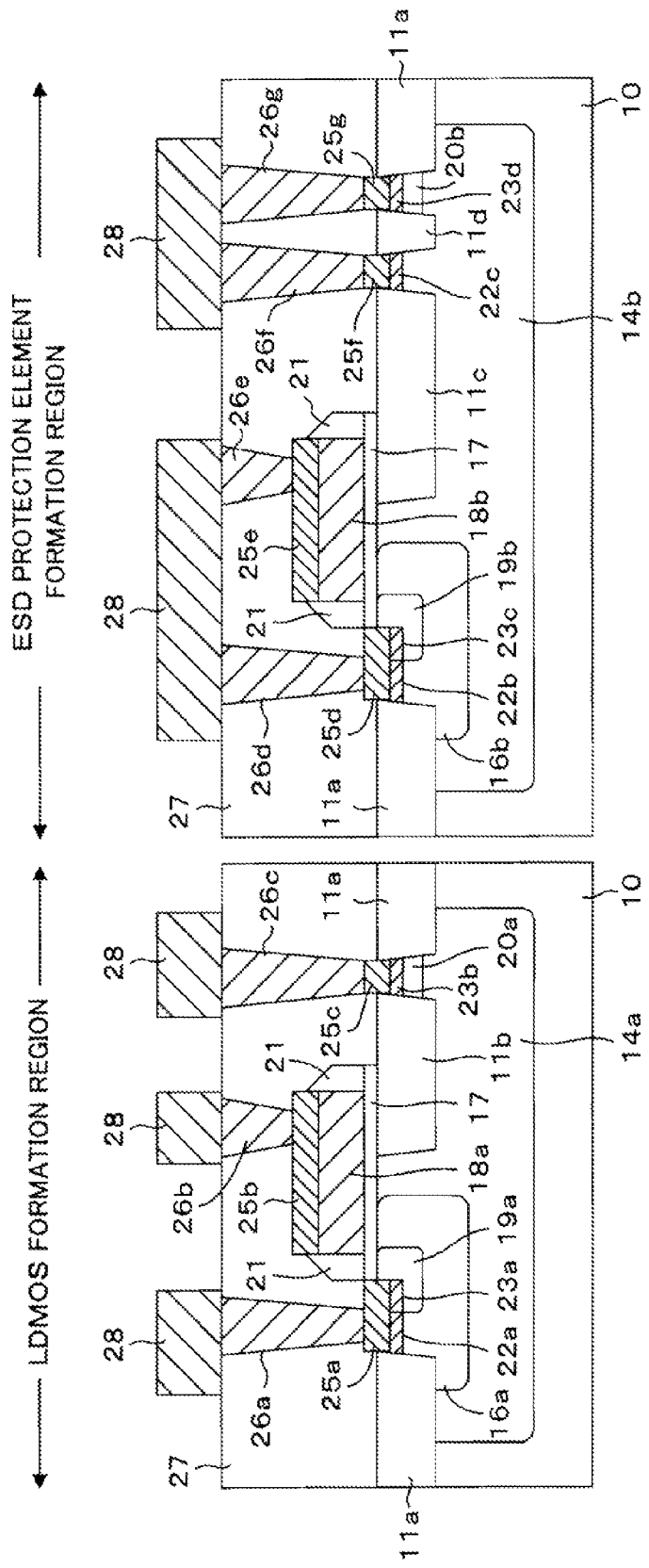
FIG. 1 is a cross sectional view of a semiconductor device of a first embodiment.
Figure 2:
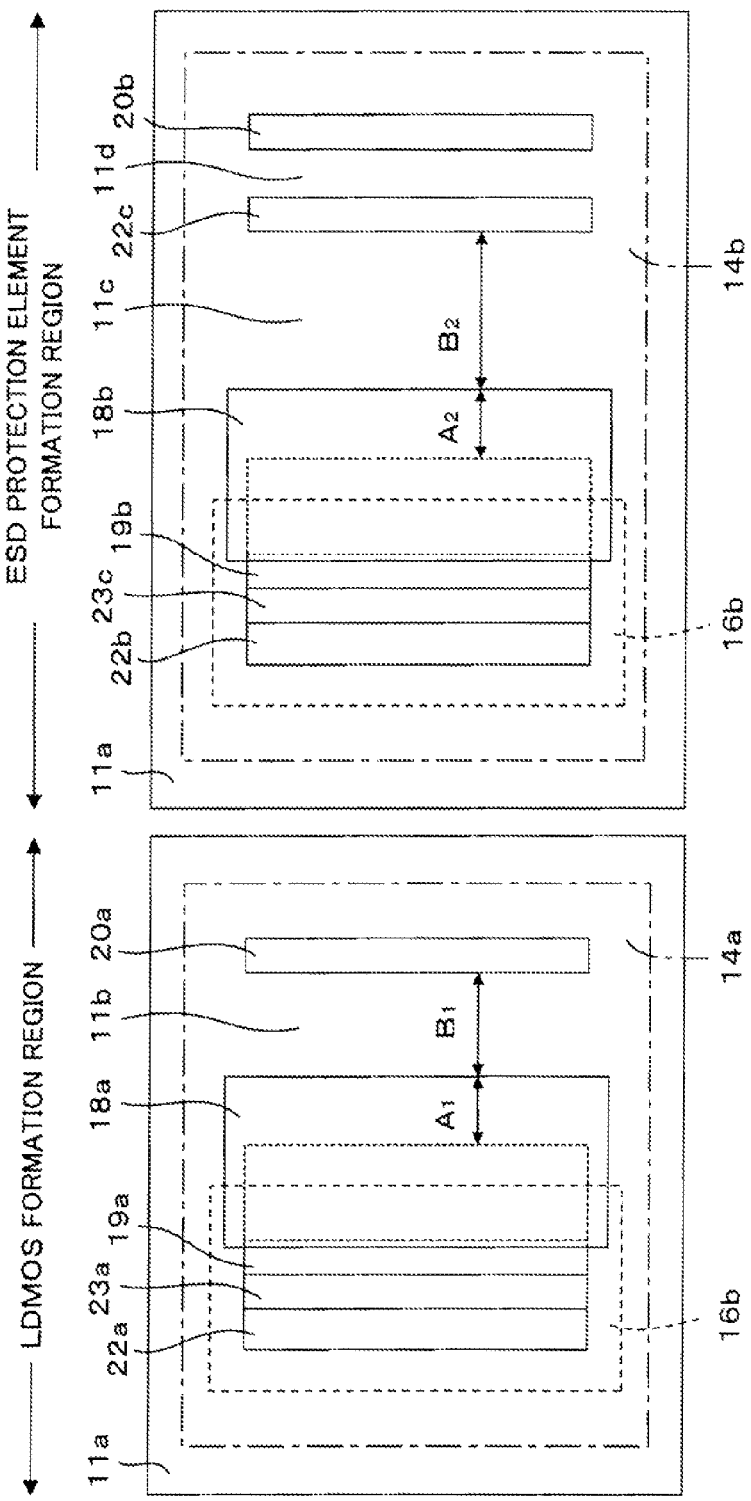
FIG. 2 is a layout of the semiconductor device of the first embodiment.

FIG. 1 is a cross sectional view of a semiconductor device of a first embodiment, and FIG. 2 is a layout of the semiconductor device. In the following description, a first conductivity type is p-type and a second conductivity type is n-type. However, the first conductivity type may be n-type and the second conductivity type may be p-type.

As illustrated in FIGS. 1 and 2, an element isolation film 11a is formed in a predetermined region of a p-type (first conductivity type) silicon semiconductor substrate 10 and defines an LDMOS transistor formation region (referred to as an LDMOS formation region in the drawings: the same shall apply below) and an ESD protection element formation region. An LDMOS transistor is formed in the LDMOS transistor formation region and a thyristor-type ESD protection element is formed in the ESD protection element formation region.

To begin with, a structure of the LDMOS transistor is described. The LDMOS transistor formation region is surrounded by the element isolation film 11a. This LDMOS transistor formation region is provided with a drift region 14a formed by introducing n-type (second conductivity type) impurities into the semiconductor substrate 10. In addition, an element isolation film 11b traversing the LDMOS transistor formation region is formed in a predetermined region in an upper portion of the semiconductor substrate 10.

A gate insulating film 17 is formed on the semiconductor substrate 10 to run along almost the center of the LDMOS transistor formation region. A portion (a right side portion in FIG. 1) of the gate insulating film 17 is arranged on the element isolation film 11b. A gate electrode 18a traversing the LDMOS transistor formation region and side walls 21 arranged at both sides of the gate electrode 18a in a width direction are formed on the gate insulating film 17. In addition, a silicide film 25b is formed on an upper surface of the gate electrode 18a.

A body region 16a formed by introducing p-type impurities is arranged at one side of the gate electrode 18a in the width direction (the left side in FIGS. 1 and 2). A source region 19a formed by introducing n-type impurities is arranged in an upper portion of the body region 16a.

An n-type high concentration impurity region 23a into which n-type impurities are introduced at a higher concentration than in the source region 19a is provide in an upper portion of the source region 19a. A p-type high concentration impurity region 22a into which p-type impurities are introduced at a higher concentration than in the body region 16a is provided in an upper portion of the body region 16a between the n-type high concentration impurity region 23a and the element isolation film 11a.

A silicide film 25a is formed on surfaces of the n-type high concentration impurity region 23a and the p-type high concentration impurity region 22a. The n-type high concentration impurity region 23a and the p-type high concentration impurity region 22a are electrically connected to each other through the silicide film 25a.

In this embodiment, the n-type high concentration impurity region 23a and the p-type high concentration impurity region 22a are in contact with each other, but an element isolation film may be formed between these impurity regions 23a, 22a. The same shall apply in other embodiments.

In the LDMOS transistor formation region, a drain region 20a formed by introducing n-type impurities is arranged between the element isolation film 11b and the element isolation film 11a on the opposite side in the width direction (the right side in FIG. 1). An n-type high concentration impurity region 23b into which n-type impurities are introduced at a higher concentration than in the drain region 20a is provided in an upper portion of the drain region 20a and a silicide film 25c is formed on a surface of the n-type high concentration impurity region 23b.

An interlayer insulating film 27 is formed on top of the semiconductor substrate 10 in the LDMOS transistor formation region, and the gate electrode 18a is covered with the interlayer insulating film 27. The silicide films 25a, 25b, 25c are electrically connected to interconnections 28 on the interlayer insulating film 27 through conductive plugs 26a, 26b, 26c, respectively.

Next, a structure of the ESD protection element is described. The ESD protection element formation region is also surrounded by the element isolation film 11a. The ESD protection element formation region is also provided with a drift region 14b formed by introducing n-type impurities into the semiconductor substrate 10. In addition, element isolation films 11c, 11d traversing the ESD protection element formation region are formed in predetermined regions in an upper portion of the semiconductor substrate 10. The element isolation films 11c, 11d are arranged in parallel with each other.

A gate insulating film 17 is formed on the semiconductor substrate 10 to traverse the ESD protection element formation region. A portion (a right side portion in FIG. 1) of the gate insulating film 17 is arranged on the element isolation film 11c. A gate electrode 18b traversing the ESD protection element formation region and side walls 21 arranged at both sides of the gate electrode 18b in the width direction are formed on the gate insulating film 17. In addition, a silicide film 25e is formed on an upper surface of the gate electrode 18b.

A body region 16b formed by introducing p-type impurities is arranged at one side of the gate electrode 18b in the width direction (the left side in FIGS. 1 and 2). A source region 19b formed by introducing n-type impurities is arranged in an upper portion of the body region 16b.

An n-type high concentration impurity region 23c into which n-type impurities are introduced at a higher concentration than in the source region 19b is provide in an upper portion of the source region 19b. A p-type high concentration impurity region 22b into which p-type impurities are introduced at a higher concentration than in the body region 16b is provided in an upper portion of the body region 16b between the n-type high concentration impurity region 23c and the element isolation film 11a.

A silicide film 25d is formed on surfaces of the n-type high concentration impurity region 23c and the p-type high concentration impurity region 22b. The n-type high concentration impurity region 23c and the p-type high concentration impurity region 22b are electrically connected to each other through the silicide film 25d.

In this embodiment, the n-type high concentration impurity region 23c and the p-type high concentration impurity region 22b are in contact with each other, but an element isolation film may be formed between these impurity regions 23c, 22b. The same shall apply in other embodiments.

In the ESD protection element formation region, an anode region 22c formed by introducing p-type impurities is formed between the element isolation film 11c and the element isolation film 11d. A silicide film 25f is formed on a surface of the anode region 22c.

In the ESD protection element formation region, a drain region 20b formed by introducing n-type impurities is arranged between the element isolation film 11d and the element isolation film 11a on the opposite side (the right side in FIG. 1). An n-type high concentration impurity region 23d into which n-type impurities are introduced at a higher concentration than in the drain region 20b is provided in an upper portion of the drain region 20b and a silicide film 25g is formed on a surface of the n-type high concentration impurity region 23d.

The interlayer insulating film 27 is also formed on top of the semiconductor substrate 10 in the ESD protection element formation region, and the gate electrode 18b is covered with the interlayer insulating film 27. The silicide films 25d, 25e, 25f, 25g are electrically connected to interconnections 28 on the interlayer insulating film 27 through conductive plugs 26d, 26e, 26f, 26g, respectively.

Figure 3:
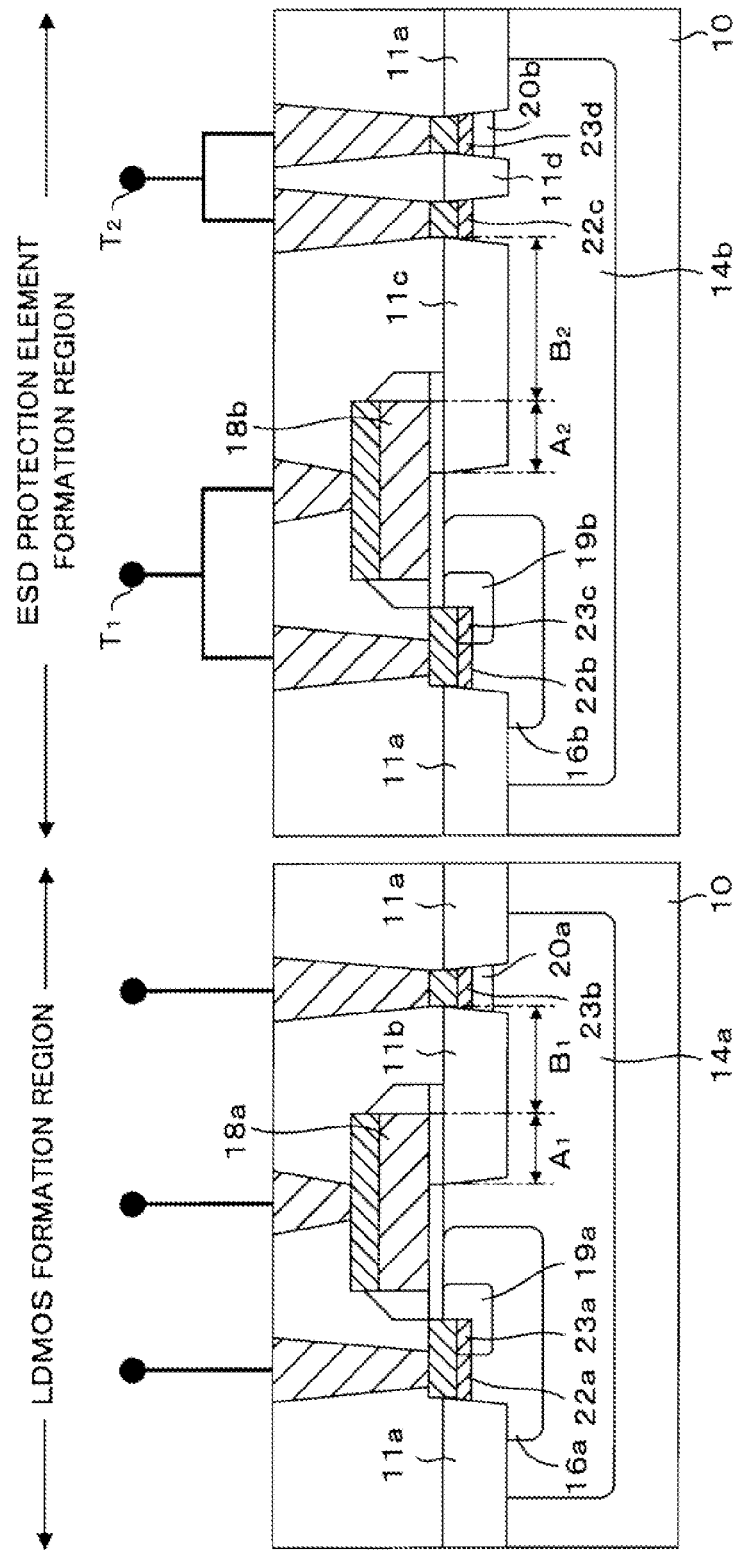
FIG. 3 is a view explaining relationships between an overlap length A1 of an element isolation film and a gate electrode above the element isolation film and a distance B1 between an edge portion of the gate electrode and a drain region in an LDMOS transistor formation region; and an overlap length A2 of an element isolation film and a gate electrode above the element isolation film and a distance B2 between an edge portion of the gate electrode and an anode region in an ESD protection element formation region.

Here, as illustrated in FIGS. 2 and 3, in the LDMOS transistor formation region, A1 denotes the length of a portion where the element isolation film 11b overlaps the gate electrode 18a above the element isolation film 11b, and B1 denotes a distance between an edge portion of the gate electrode 18a and the drain region 20a (that is, a distance in a direction parallel to the substrate surface). In addition, in the ESD protection element formation region, A2 denotes a length of a portion where the element isolation film 11c overlaps the gate electrode 18b above the element isolation film 11c, and B2 denotes a distance between an edge portion of the gate electrode 18b and the anode region 22c (that is, a distance in the direction parallel to the substrate surface). In this case, the semiconductor device of the present embodiment has relationships of A1≧A2 and B1<B2.

Hereinafter, the ESD protection element with the foregoing structure will be described in more detail. For instance, as illustrated in FIG. 3, the source region 19b, the body region 16b and the gate electrode 18b in the ESD protection element are connected to a single terminal T1. In addition, the anode region 22c and the drain region 20b are connected to a single terminal T2. The terminal T1 is connected to a low potential terminal of an internal circuit (the circuit including the LDMOS transistor), and the terminal T2 is connected to a high potential terminal of the internal circuit, for example.

Figure 4:
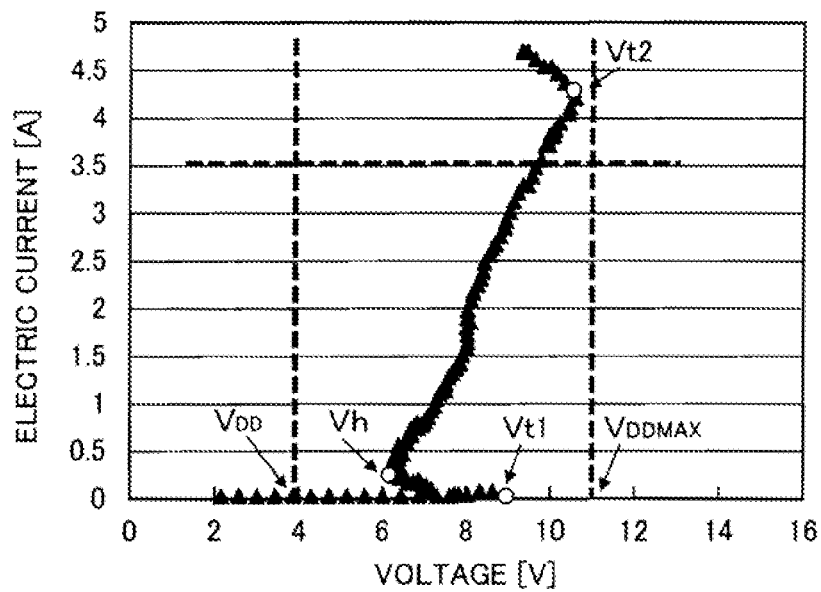
FIG. 4 is a diagram explaining an operation of an ESD protection element.

FIG. 4 is a diagram explaining an operation of the ESD protection element with a voltage on the horizontal axis and an electric current on the vertical axis. Here, an operation voltage in the internal circuit of the semiconductor device (a highest voltage applied between the terminals T1 and T2 in a normal operation) is denoted by $V_{DD}$, an operation start voltage of the ESD protection element is denoted by Vt1, and a voltage to break down the internal circuit (hereinafter, referred to as a breakdown voltage) is denoted by $V_{DDMAX}$. It is important that the operation start voltage Vt1 of the ESD protection element is higher than the operation voltage $V_{DD}$ of the internal circuit and is lower than the breakdown voltage $V_{DDMAX}$.

The ESD protection element is in an off state when the voltage applied to the internal circuit is lower than the operation start voltage Vt1. When a higher voltage is applied between the terminals T1, T2 due to static electricity or the like, the ESD protection element is turned into an on state and an electric current flows into the ESD protection element. At this time, the electric current flowing through the ESD protection element causes a change in the voltage between the terminals T1, T2. Here, what is important is that even the peak voltage between the terminals T1, T2 does not exceed the breakdown voltage $V_{DDMAX}$.

When the voltage is applied between the terminals T1, T2, a depletion layer expands between the body region 16b and the drift region 14b and a depletion layer expands between the drift region 14b and the anode region 22c. Consequently, a punch-through more likely occurs. The punch-through is a phenomenon in which the depletion layer between the body region 16b and the drift region 14b and the depletion layer between the drift region 14b and the anode region 22c are connected to each other to cause a large electric current to flow.

One possible method to prevent a punch-through is to make the impurity concentration of the drift region 14b in the ESD protection element formation region higher than the impurity concentration of the drift region 14a in the LDMOS transistor formation region. In this case, however, since a junction breakdown voltage between the body region 16b and the drift region 14b is lowered, the operation start voltage Vt1 of the ESD protection element may become lower than the operation voltage $V_{DD}$ of the LDMOS transistor even though the punch-through is prevented. In addition, there also arises another problem of an increase in the number of manufacturing processes.

Another possible method to prevent a punch-through is to increase the distance between the body region 16b and the anode region 22c. A simple increase in the distance between the body region 16b and the anode region 22c, however, may raise the junction breakdown voltage between the body region 16b and the drift region 14b and thereby make the operation start voltage Vt1 of the ESD protection element higher than the breakdown voltage $V_{DDMAX}$ of the internal circuit. Moreover, this method impedes achievement of higher integration of the semiconductor device.

In the LDMOS transistor, the junction breakdown voltage between the body region and the drift region largely depends on the length (overlap length) of the portion where the element isolation film overlaps the gate electrode.

Figure 5:
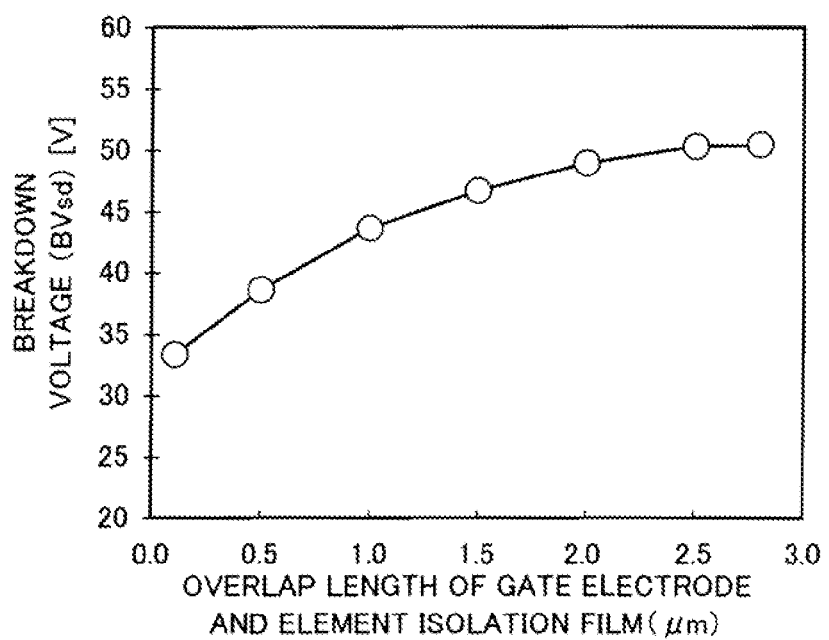
FIG. 5 is a diagram exemplifying a relationship between a breakdown voltage and the overlap length of the gate electrode and the element isolation film.

FIG. 5 is a diagram exemplifying a relationship between a breakdown voltage and the overlap length of the gate electrode and the element isolation film, with the breakdown voltage on the vertical axis and the overlap length on the horizontal axis.

As is apparent from FIG. 5, the junction breakdown voltage between body region 16a or 16b and drift region 14a or 14b depends on the overlap length of the gate electrode 18a or 18b and the element isolation film 11b or 11c. This is because a voltage applied to the gate electrode 18a or 18b largely influences the expansion of the depletion layer in the drift region 14a or 14b.

When the overlap length A2 is made longer than the overlap length A1 (A1<A2), the junction breakdown voltage between the drift region 14b and the body region 16b in the ESD protection element becomes higher than the junction breakdown voltage between the drift region 14a and the body region 16a in the LDMOS transistor. As a result, the operation start voltage Vt1 of the ESD protection element may become higher than the breakdown voltage $V_{DDMAX}$ of the internal circuit, in some cases.

To prevent this, in the present embodiment, the overlap length A2 of the gate electrode 18b and the element isolation film 11c in the ESD protection element is set equal to or slightly shorter than the overlap length A1 of the gate electrode 18a and the element isolation film 11b in the LDMOS transistor (A1≧A2). With this setting, the junction breakdown voltage between the body region 16b and the drift region 14b in the ESD protection element is made equal to or slightly smaller than the junction breakdown voltage between the body region 16a and the drift region 14a in the LDMOS transistor.

In the present embodiment, the distance between the edge portion of the gate electrode 18b and the anode region 22c is increased to prevent the occurrence of a punch-through. The increase in the distance between the edge portion of the gate electrode 18b and the anode region 22c may raise the junction breakdown voltage between the body region 16b and the drift region 14b in the ESD protection element in some cases depending on manufacturing conditions. This influence, however, is smaller than in the case where the overlap length of the gate electrode and the element isolation film is changed.

As described above, the distance between the edge portion of the gate electrode 18b and the anode region 22c is increased. This increase more suppresses an enlargement of the ESD protection element formation region than in the case where the distance between the body region and the anode region is simply increased. In this way, the semiconductor device obtains a desirable characteristic while achieving higher integration.

Hereinafter, the characteristic of the ESD protection element of the semiconductor device according to the embodiment will be explained in comparison with a comparative example.

Figure 6A:
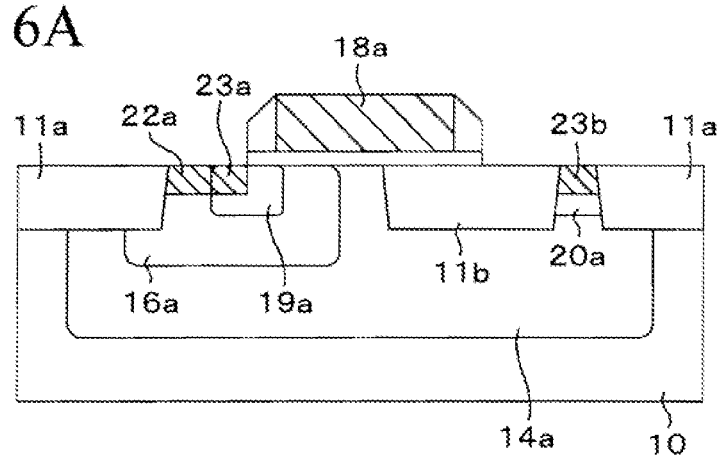
FIG. 6A is a cross sectional view of a semiconductor device according to the embodiment and a comparative example.
Figure 6B:
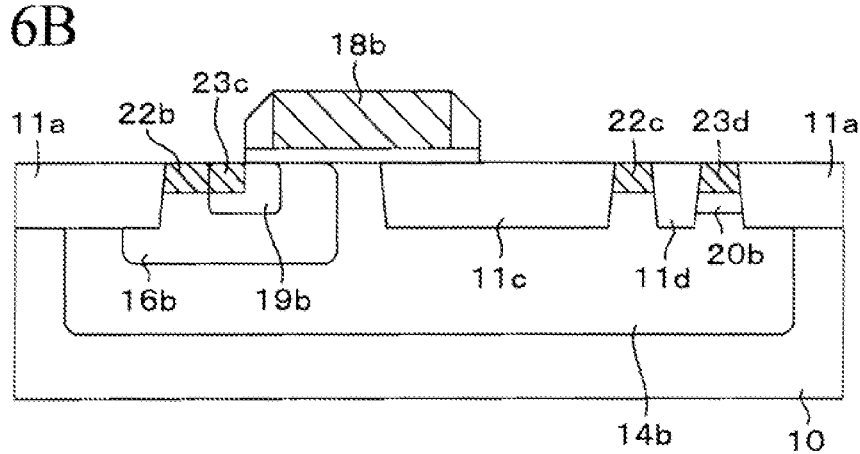
FIG. 6B is a cross sectional view of the ESD protection element in the semiconductor device of the embodiment.
Figure 6C:
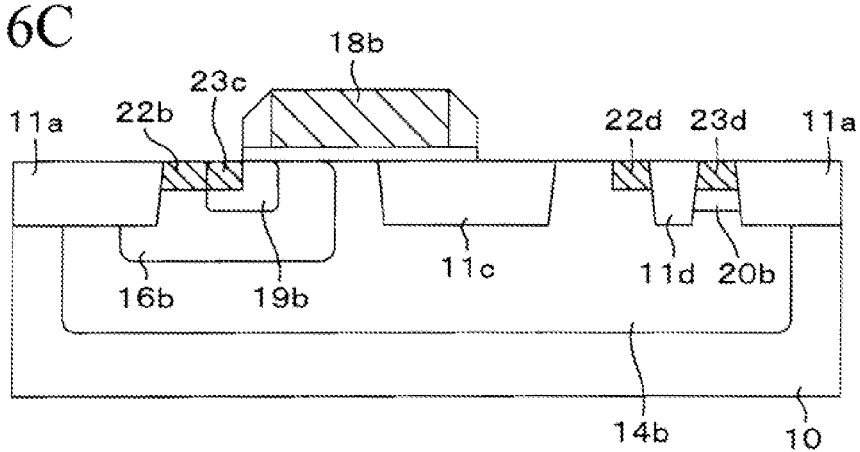
FIG. 6C is a cross sectional view of an ESD protection element in the semiconductor device of the comparative example.

FIG. 6A is a cross sectional view of the LDMOS transistors of the semiconductor devices in the embodiment and the comparative example, FIG. 6B is a cross sectional view of the ESD protection element of the semiconductor device in the embodiment, and FIG. 6C is a cross sectional view of the ESD protection element of the semiconductor device in the comparative example. In FIGS. 6A to 6C, the same portions as those in FIG. 1 are indicated by the same reference numerals. In addition, in FIGS. 6A to 6C, illustrations of the silicide film, the interlayer insulating film and the like are omitted. Hereinafter, the ESD protection element of the semiconductor device in the embodiment is simply referred to as the ESD protection element in the embodiment, and the ESD protection element of the semiconductor device in the comparative example is simply referred to as the ESD protection element in the comparative example.

The ESD protection elements of the semiconductor devices in the embodiment and the comparative example are the same in shape and size. In the ESD protection element in the embodiment (see FIG. 6B), the anode region 22c is in contact with the element isolation films 11c, 11d. On the other hand, in the ESD protection element in the comparative example (see FIG. 6C), the anode region 22d is away from the element isolation film 11c because the element isolation film 11c has a smaller width. The ESD protection element in the embodiment and the ESD protection element in the comparative example are the same in the other portions.

Figure 7:
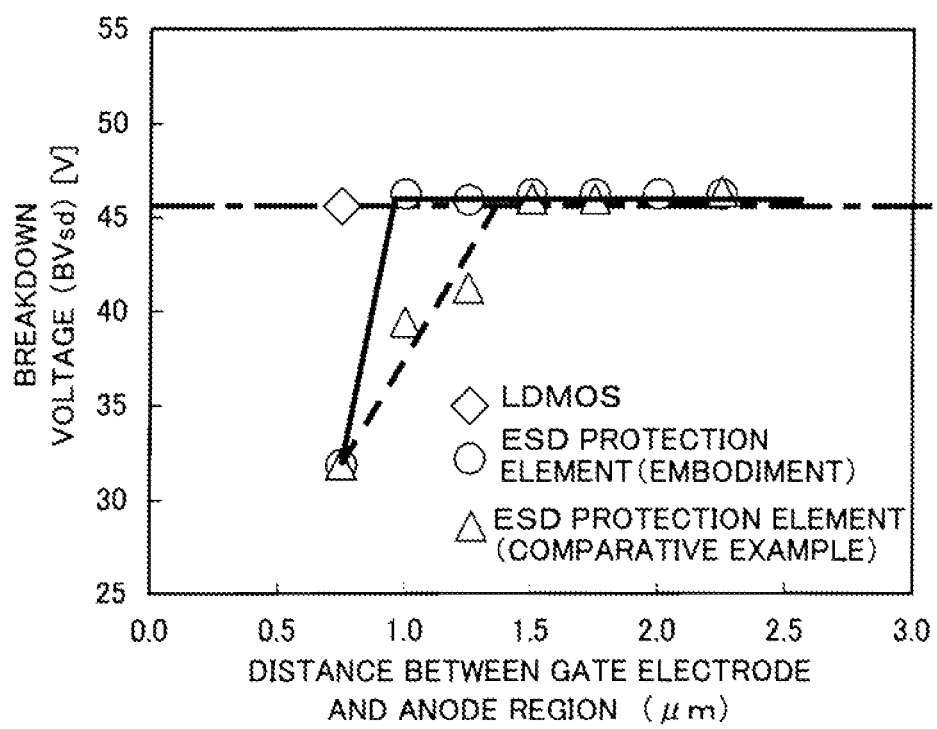
FIG. 7 is a diagram illustrating simulation results of breakdown voltage characteristics of the ESD protection element in the embodiment and of the ESD protection element in the comparative example.

FIG. 7 is a diagram illustrating simulation results of breakdown voltage characteristics of the ESD protection element in the embodiment and the ESD protection element in the comparative example, with the distance between the gate electrode and the anode region on the horizontal axis and with the breakdown voltage on the vertical axis. Here, the overlap length of the gate electrode 18b and the element isolation film 11c is 0.75 μm in both the ESD protection elements in the embodiment and the comparative example. FIG. 7 also illustrates the breakdown voltage characteristic of the LDMOS transistor. In the case of the LDMOS transistor, the horizontal axis indicates the distance between the gate electrode and the drain region.

As is apparent from FIG. 7, the ESD protection element in the embodiment is prevented from causing a punch-through if the distance between the gate electrode 18b and the anode region 22c is set to about 1.0 μm or longer. In contrast, the ESD protection element in the comparative example causes a punch-through when the distance between the gate electrode 18b and the anode region 22d is about 1.0 μm, and may need to be configured with the distance between the gate electrode 18b and the anode region 22d set to about 1.5 μm or longer to prevent a punch-through.

This is because, in the ESD protection element in the comparative example, the anode region 22d is away from the element isolation film 11c and therefore the depletion layer between the drift region 14b and the anode region 22d is more likely to expand toward the body region 16b than in the ESD protection element in the embodiment.

As is clear in FIG. 7, the ESD protection element in the embodiment has an almost constant operation start voltage Vt1 (=$BV_{sd}$) even when the distance between the gate electrode 18b and the anode region 22c is changed. In other words, the operation start voltage Vt1 is determined by the overlap length of the gate electrode 18b and the element isolation film 11c irrespective of the distance between the gate electrode 18b and the anode region 22c.

Figure 8:
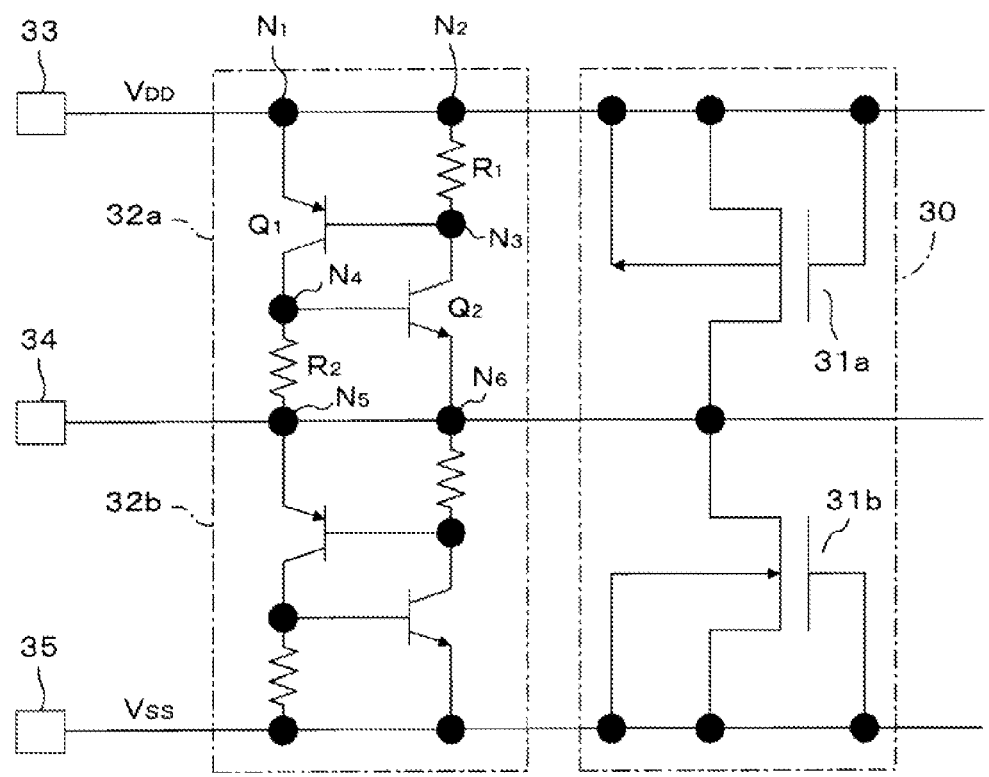
FIG. 8 is a circuit diagram illustrating an example of an electronic circuit including the semiconductor device in the embodiment.

FIG. 8 is a circuit diagram illustrating an example of an electronic circuit including the semiconductor device in the present embodiment.

An output circuit 30 includes a p-type LDMOS transistor 31a and an n-type LDMOS transistor 31b. The source, gate and body of the p-type LDMOS transistor 31a are connected to a high potential power supply terminal 33, whereas the source, gate and body of the n-type LDMOS transistor 31b are connected to a low potential power supply terminal 35. Both the drain of the p-type LDMOS transistor 31a and the drain of the n-type LDMOS transistor 31b are connected to an output terminal 34.

A first ESD protection element 32a and a second ESD protection element 32b are arranged in a preceding stage of the output circuit 30 (on the terminal 33, 35 side). The first ESD protection element 32a is connected between the high potential power supply terminal 33 and the output terminal 34, and the second ESD protection element 32b is connected between the output terminal 34 and the low potential power supply terminal 35.

In FIG. 8, in the first ESD protection element 32a, a node N1 represents the silicide film 25f on the anode region 22c (see FIG. 1), and a node N2 represents the silicide film 25g on the drain region 20b. In addition, a node N3 represents the drift region 14b, and a node N4 represents the body region 16b. Nodes N5, N6 represent the silicide film 25d on the p-type high concentration impurity region 22b and the n-type high concentration impurity region 23c, respectively.

A transistor Q1 is formed of the anode region 22c, the drift region 14b and the body region 16b, and a transistor Q2 is formed of the drift region 14b, the body region 16b and the source region 19b. Moreover, a resistor R1 is formed of the drift region 14b, and a resistor R2 is formed of the body region 16b.

In the circuit in FIG. 8, the transistors Q1, Q2 are in the off state while a normal voltage (the operation voltage of the internal circuit) is applied between the high potential power supply terminal 33 and the output terminal 34, or between the output terminal 34 and the low potential power supply terminal 35. At this time, the normal voltage is supplied to the internal circuit (the output circuit 30 and the subsequent circuits).

When a high voltage is applied between the high potential power supply terminal 33 and the output terminal 34, or between the output terminal 34 and the low potential power supply terminal 35 due to, for example, static electricity or the like, the transistors Q1, Q2 are turned on and the electric currents flow into the ESD protection elements 31a, 31b. This lowers the voltage applied to the internal circuit and avoids a breakdown of the internal circuit.

FIGS. 9A to 9I are cross sectional views illustrating a method of manufacturing the semiconductor device of the first embodiment in the order of manufacturing processes. With reference to these drawings, the method of manufacturing the semiconductor device of the first embodiment will be described.

To begin with, the p-type silicon semiconductor substrate 10 is prepared as illustrated in FIG. 9A. Then, the element isolation film 11a defining the LDMOS transistor formation region and the ESD protection element formation region is formed in the semiconductor substrate 10 by use of a known shallow trench isolation (STI) method. Also at this time, the element isolation film 11b is formed in the LDMOS transistor formation region and the element isolation films 11c, 11d are formed in the ESD protection element formation region.

Specifically, trenches with a depth of 350 nm, for example, are formed in a predetermined pattern in the semiconductor substrate 10 by using a photolithography method and etching method. Then, an insulating substance such as a silicon oxide or a silicon nitride is filled into the trenches to form the element isolation film 11a and the element isolation films 11b, 11c, 11d.

In the present embodiment, in the LDMOS transistor formation region, the distance between the element isolation film 11b and the element isolation film 11a on one side (the left side in FIG. 9A) is 2.8 µm, and the distance between the element isolation film 11b and the element isolation film 11a on the other side (the right side in FIG. 9A) is 1.62 µm. In addition, the width of the element isolation film 11b is 1.5 µm.

In addition, in the present embodiment, in the ESD protection element formation region, the distance between the element isolation film 11c and the element isolation film 11a on one side (the left side in FIG. 9A) is 2.8 µm, and the distance between the element isolation film 11c and the element isolation film 11d is 1.62 µm, and the distance between the element isolation film 11d and the element isolation film 11a on the other side (the right side in FIG. 9A) is 1.62 µm. In addition, the width of the element isolation film 11c is 3 µm, and the width of the element isolation film 11d is 0.24 µm.

After the element isolation film 11a and the element isolation films 11b, 11c, 11d are formed as described above, the surface of the semiconductor substrate 10 is thermally oxidized to form an oxide film 13 with a thickness of, for example, 10 nm.

Next, a process performed to obtain a structure in FIG. 9B will be explained. After the oxide film 13 is formed in the above process, a photoresist is applied onto the oxide film 13 to form a photoresist film (not illustrated). Then, exposure and development processes are performed on the photoresist film to provide the photoresist film with opening portions at locations corresponding to the LDMOS transistor formation region and the ESD protection element formation region. Thereafter, n-type impurity ions are implanted into the semiconductor substrate 10 through the opening portions.

In the above process, P (phosphorus) ions as n-type impurities are implanted twice into the semiconductor substrate 10. For instance, first ion implantation conditions are an implantation energy of 2.0 MeV and a dose of $2.5 \times 10^{12}$ cm$^{-2}$, and second ion implantation conditions are an implantation energy of 500 keV and a dose of $1.5 \times 10^{12}$ cm$^{-2}$.

Incidentally, the ion implantation into the semiconductor substrate 10 may be completed by performing two or more times of ion implantations as described above, or one time of ion implantation.

In this way, the n-type drift region 14a is formed in the LDMOS transistor formation region, and the n-type drift region 14b is formed in the ESD protection element formation region. Then, the photoresist film is removed.

Figure 9C:
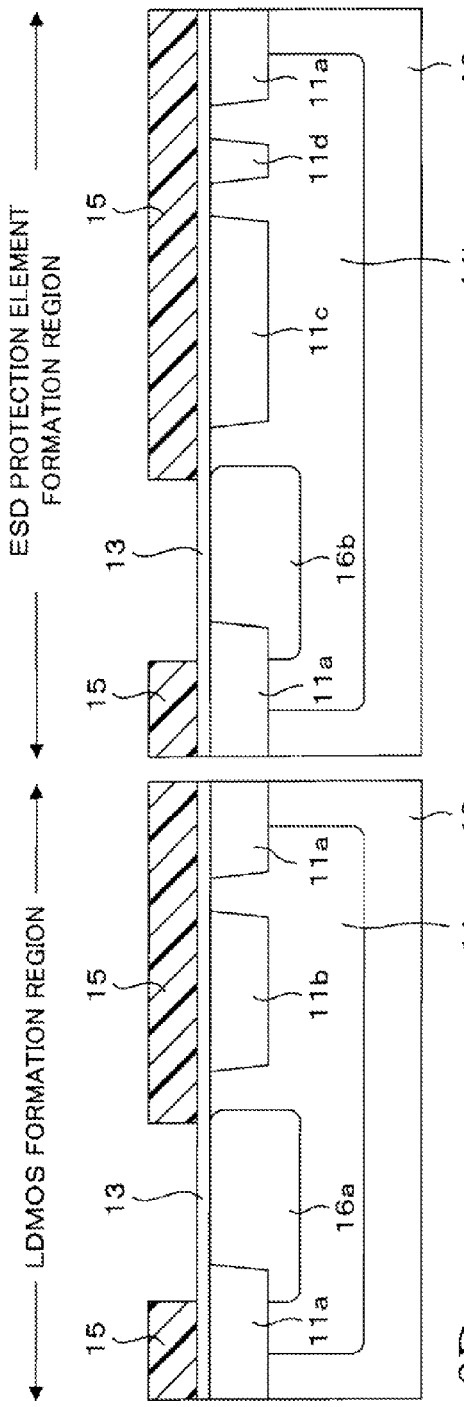

Hereinbelow, a process performed to obtain a structure in FIG. 9C will be described. After the formation of the drift regions 14a, 14b in the foregoing process, a photoresist is applied onto the oxide film 13 to form a photoresist film 15. Then, the photoresist film 15 is processed by the exposure and development processes and thus is provided with opening portions at predetermined regions. After that, p-type impurity ions are implanted into the semiconductor substrate 10 (drift regions 14a, 14b) through the opening portions. In this way, the p-type body region 16a is formed in the LDMOS transistor formation region and the p-type body region 16b is formed in the ESD protection element formation region.

In the above process, three times of ion implantations are performed by using B (boron) as p-type impurities. For instance, first ion implantation conditions are an implantation energy of 420 keV and a dose of $1 \times 10^{13}$ cm$^2$, second ion implantation conditions are an implantation energy of 150 keV and a dose of $5 \times 10^{12}$ cm$^2$, and third ion implantation conditions are an implantation energy of 15 keV and a dose of $1 \times 10^{13}$ cm$^{-2}$.

The dose into each of the body regions 16a, 16b has an influence on a threshold voltage of the transistor. The ion implantation to form the body regions 16a, 16b may be completed by performing two or more times of ion implantations as described above, or one time of ion implantation.

The body region 16a in the LDMOS transistor formation region is in contact with the element isolation film 11a, but is away from the element isolation film 11b. The body region 16b in the ESD protection element formation region is also in contact with the element isolation film 11a, but is away from the element isolation film 11c.

Figure 9D:
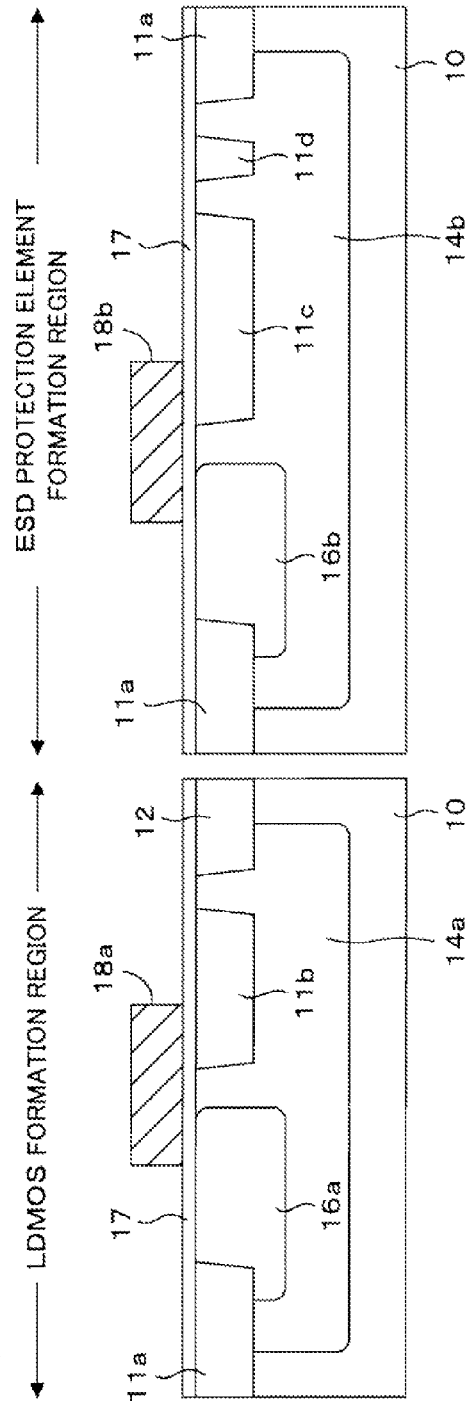

Next, a process performed to obtain a structure in FIG. 9D will be described. After the formation of the body regions 16a, 16b in the foregoing process, the photoresist film 15 used to form the body regions 16a, 16b is removed. Then, a heat treatment at a temperature of 1000° C., for example, is performed to activate the impurities. Subsequently, the insulating film 13 damaged by the ion implantations and the like is removed. Thereafter, the surface of the semiconductor substrate 10 is again thermally oxidized to form the gate insulating film 17. In the present embodiment, the gate insulating film 17 has a thickness of 16 nm.

Next, with use of a CVD method, a polysilicon film with a thickness of, for example, 180 nm is formed on the gate insulating film 17. Then, the polysilicon film is patterned by use of the photolithography method and etching method, and thereby the gate electrode 18a is formed in the LDMOS transistor formation region, and the gate electrode 18b is formed in the ESD protection element formation region.

In this process, the gate electrode 18a is formed such that one end portion thereof in the width direction overlaps the body region 16a and the other end portion thereof overlaps the element isolation film 11b when the gate electrode 18a is viewed from above. In addition, the gate electrode 18b is formed such that one end portion thereof overlaps the body region 16b and the other end portion thereof overlaps the element isolation film 11c when the gate electrode 18b is viewed from above.

Here, the overlap length of the gate electrode 18b and the element isolation film 11c is set equal to the overlap length of the gate electrode 18a and the element isolation film 11b. The overlap length of the gate electrode 18b and the element isolation film 11c may be set slightly shorter than the overlap length of the gate electrode 18a and the element isolation film 11b.

Hereinafter, a process performed to obtain a structure in FIG. 9E will be explained. After the formation of the gate electrodes 18a, 18b in the above process, a photoresist film (not illustrated) provided with opening portions in a predetermined pattern is formed on top of the semiconductor substrate 10. Then, n-type impurity ions are implanted into the semiconductor substrate 10 through the opening portions of the photoresist film to form the source regions 19a, 19b and the drain regions 20a, 20b. Here, the ion implantation is performed by using P (phosphorus) as the n-type impurity under conditions of, for example, an implantation energy of 35 keV and a dose of $3.7 \times 10^{13}$ cm$^{-2}$.

The source region 19a is formed in the upper portion of the body region 16a at a position adjacent to the gate electrode 18a and away from the element isolation film 11a when viewed from above. Similarly, the source region 19b is formed in the upper portion of the body region 16b at a position adjacent to the gate electrode 18b and away from the element isolation film 11a when viewed from above.

In addition, the drain region 20a is formed between the element isolation film 11b and the element isolation film 11a and the drain region 20b is formed between the element isolation film 11d and the element isolation film 11a.

Next, a process performed to obtain a structure in FIG. 9F will be explained. After the formation of the source regions 19a, 19b and the drain regions 20a, 20b in the above process, the photoresist film used to form the source regions 19a, 19b and the drain regions 20a, 20b is removed.

Then, an insulating film with a thickness of 100 nm made of a silicon oxide, a silicon nitride or the like is formed on the entire upper side of the semiconductor substrate 10 by use of the CVD method, for example. Thereafter, the insulating film is processed by anisotropic etching and thereby is left as the side walls 21 on both sides of each of the gate electrodes 18a, 18b. After that, a portion of the gate insulating film 17 not covered with the gate electrodes 18a, 18b and the side walls 21 is removed by etching.

Subsequently, a process performed to obtain a structure in FIG. 9G will be explained. After the etching of the gate insulating film 17 in the above process, a photoresist film (not illustrated) provided with opening portions in a predetermined pattern is formed on top of the semiconductor substrate 10. After that, p-type impurities are implanted into the semiconductor substrate 10 through the opening portions of the photoresist film to form the p-type high concentration impurity regions 22a, 22b and the anode region 22c.

The ion implantation here is performed by using B (boron) as the p-type impurity under conditions of an implantation energy of 5 keV and a dose of $2 \times 10^{15}$ cm$^{-2}$. The p-type high concentration impurity region 22a is formed in a surface portion of the body region 16a between the source region 19a and the element isolation film 11a in the LDMOS transistor formation region. In addition, the p-type high concentration impurity region 22b is formed in a surface portion of the body region 16b between the source region 19b and the element isolation film 11a in the ESD protection element formation region, and the anode region 22c is formed between the element isolation film 11c and the element isolation film 11d.

Next, a process performed to obtain a structure in FIG. 9H will be explained. After the formation of the p-type high concentration impurity regions 22a, 22b and the anode region 22c in the above process, the photoresist film used to form the p-type high concentration impurity regions 22a, 22b and the anode region 22c is removed.

Then, after a photoresist film covering the entire upper side of the semiconductor substrate 10 is formed, exposure and development processes are performed on the photoresist film to provide opening portions in the photoresist film. Thereafter, n-type impurities are implanted into the surface of the semiconductor substrate 10 through the opening portions to form the n-type high concentration impurity regions 23a, 23b, 23c, 23d.

The ion implantation herein is performed by using P (phosphorus) as the n-type impurities under conditions of an implantation energy of 15 keV and a dose of $2 \times 10^{15}$ cm$^{-2}$. The n-type high concentration impurity region 23a is formed in a surface portion of the source region 19a between the p-type high concentration impurity region 22a and one of the side walls 21, and the n-type high concentration impurity region 23b is formed in a surface portion of the drain region 20a. In addition, the n-type high concentration impurity region 23c is formed in a surface portion of the source region 19b between the p-type high concentration impurity region 22b and one of the side walls 21, and the n-type high concentration impurity region 23d is formed in a surface portion of the drain region 20b.

Figure 9I:
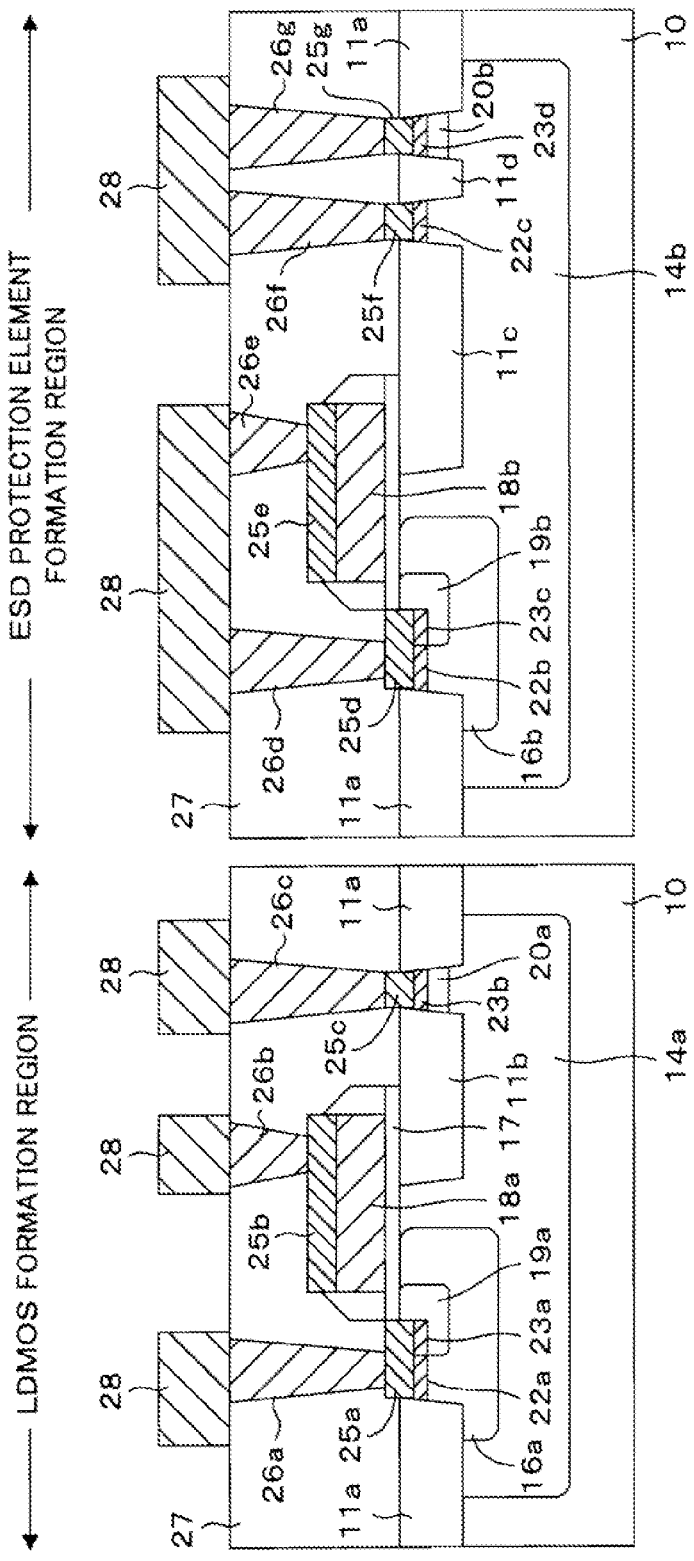

Next, a process performed to obtain a structure in FIG. 9I will be explained. After the formation of the n-type high concentration impurity regions 23a, 23b, 23c, 23d in the above process, the photoresist film used to form the n-type high concentration impurity regions 23a, 23b, 23c, 23d is removed. Then, a heat treatment at a temperature of 1000° C., for example, is performed to activate the impurities.

Thereafter, a metal film made of Co (cobalt) or the like is formed on the entire upper side of the semiconductor substrate 10 and is processed by a heat treatment. With this heat treatment, the silicon in the surface of the semiconductor substrate 10 and the surface of the gate electrodes 18a, 18b react with metal elements in the metal film to form a siliside. Then, the metal film left unreacted is removed.

In this way, in the LDMOS transistor formation region, the silicide film 25a is formed on the surfaces of the p-type high concentration impurity region 22a and the n-type high concentration impurity region 23a and the silicide film 25b is formed on the upper surface of the gate electrode 18a. Moreover, the silicide film 25c is formed on the surface of the n-type high concentration impurity region 23b.

Meanwhile, in the ESD protection element formation region, the silicide film 25d is formed on the surfaces of the p-type high concentration impurity region 22b and the n-type high concentration impurity region 23c, and the silicide film 25e is formed on the upper surface of the gate electrode 18b. In addition, the silicide film 25f is formed on the surface of the anode region 22c and the silicide film 25g is formed on the surface of the n-type high concentration impurity region 23d.

Then, an insulating substance such for example as a silicon oxide or a silicon nitride is deposited on the entire upper side of the semiconductor substrate 10 by using the CVD method or the like, and thereby the interlayer insulating film 27 is formed. The interlayer insulating film 27 may be formed of a single insulating film or a stack of two or more insulating films. Thereafter, the surface of the interlayer insulating film 27 is polished and flattened by the CMP method.

After that, by use of the photolithography method and the etching method, contact halls are formed to extend from the surface of the interlayer insulating film 27 down to the silicide films 25a, 25b, 25c, 25d, 25e, 25f, 25g, respectively. Then, a conductive material such as W (tungsten) is filled into these contact halls to form conductive plugs 26a, 26b, 26c, 26d, 26e, 26f, 26g.

Then, a conductive film is formed of aluminum or the like on the entire upper side of the semiconductor substrate 10, and thereafter the conductive film is patterned by use of the photolithography method and the etching method. In this way, the first layer of the interconnection 28 is formed in a predetermined pattern.

Subsequently, the interlayer insulating film formation process, the conductive plug formation process, and the interconnection layer formation process are repeatedly performed to form a multi-layer interconnection structure. Then, a protection film is formed on the multi-layer interconnection structure. Thereafter, the protection film on a lead electrode is etched by use of the photolithography method and the etching method. In this way, the semiconductor device including the LDMOS transistor and the ESD protection element according to the present embodiment is completed.

The present embodiment involves a small number of manufacturing processes because the LDMOS transistor and the ESD protection element are formed at the same time. Thus, the present embodiment produces an effect of reduction in product costs.

Second Embodiment

Figure 11:
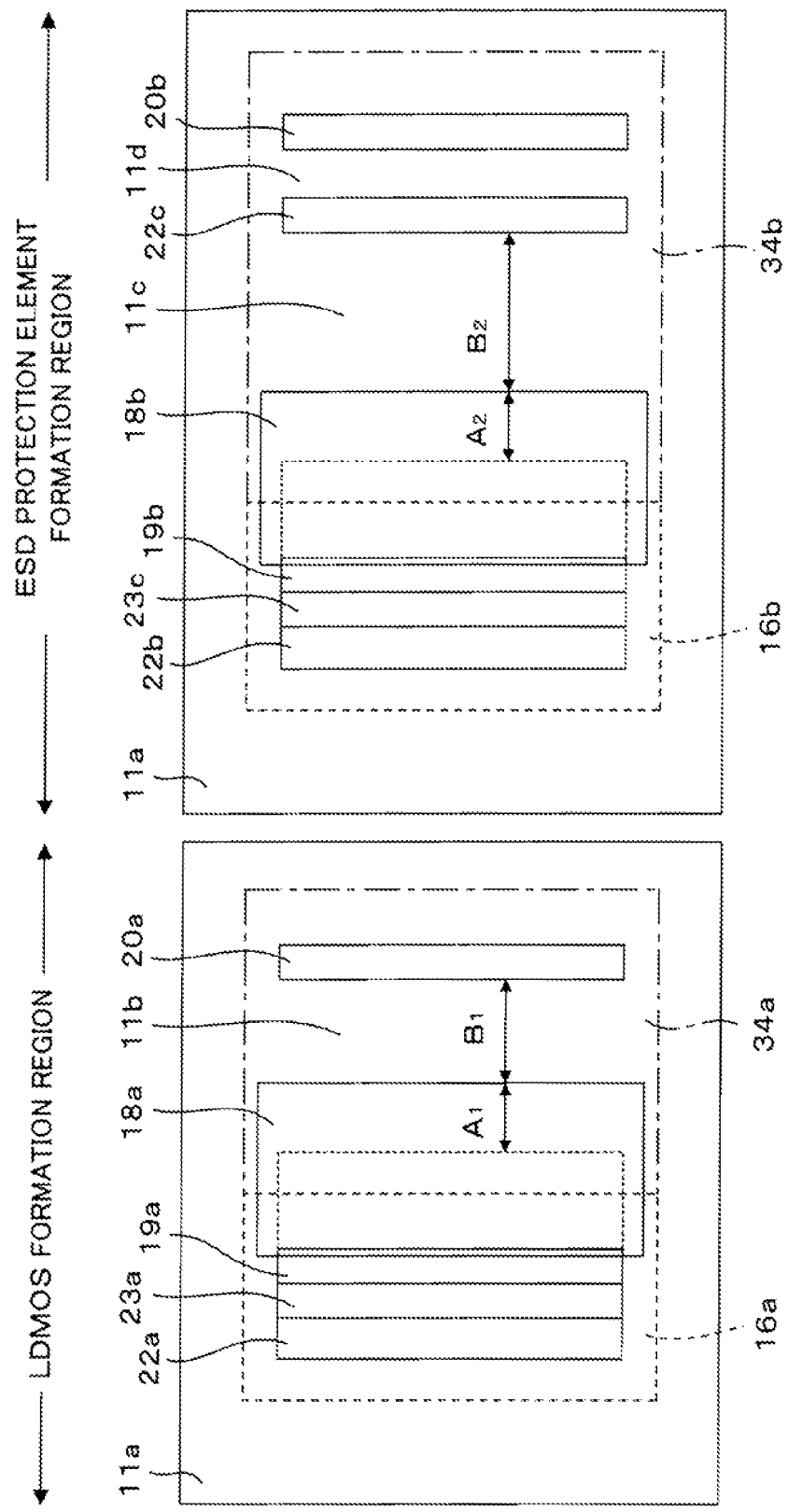
FIG. 11 is a top view of the semiconductor device of the second embodiment.

FIGS. 10A to 10D are cross sectional views illustrating a method of manufacturing the semiconductor device of a second embodiment in the order of manufacturing processes. FIG. 11 is a top view of a semiconductor device according to the second embodiment.

To begin with, a p-type silicon semiconductor substrate 10 is prepared as illustrated in FIG. 10A. Then, an element isolation film 11a is formed in the semiconductor substrate 10 to define an LDMOS transistor formation region and an ESD protection element formation region in the same method as in the first embodiment. In addition, at the same time, an element isolation film 11b is formed in the LDMOS transistor formation region and element isolation films 11c, 11d are formed in the ESD protection element formation region. Then, the surface of the semiconductor substrate 10 is thermally oxidized to form an oxide film 13.

Next, a process performed to obtain a structure in FIG. 10B will be explained. After the oxide film 13 is formed in the above process, a photoresist film (not illustrated) is formed on the oxide film 13. Then, the photoresist film is processed by exposure and development processes, and thereby is provided with opening portions at predetermined regions. Thereafter, n-type impurity ions are implanted into the semiconductor substrate 10 through the opening portions.

The ion implantation herein is performed by using P (phosphorus) as the n-type impurities under conditions of an implantation energy of 300 keV to 2.0 MeV, and a dose of $10^{12}$ cm$^{-2}$ to $3\times10^{13}$ cm$^{-2}$. This ion implantation may be completed by performing one time of ion implantation or two or more times of ion implantations.

Then, the photoresist film is removed. In this way, a drift region 34a is formed in the LDMOS transistor formation region and a drift region 34b is formed in the ESD protection element formation region.

As illustrated in FIG. 10B, the drift region 34a in the LDMOS transistor formation region surrounds the element isolation film 11b, and is away from the element isolation film 11a on one side (the left side in FIG. 10B) but is in contact with the element isolation film 11a on the other side (the right side in FIG. 10B).

In addition, as illustrated in FIG. 10B, the drift region 34b in the ESD protection element formation region surrounds the element isolation films 11c, 11d, and is away from the element isolation film 11a on one side (the left side in FIG. 10B) but is in contact with the element isolation film 11a on the other side (the right side in FIG. 10B).

Next, a process performed to obtain a structure in FIG. 10C will be explained. After the formation of the drift regions 34a, 34b in the above process, a photoresist film (not illustrated) is formed on the oxide film 13 and the photoresist film is processed by exposure and development processes, and thereby is provided with opening portions at predetermined regions. Thereafter, p-type impurity ions are implanted into the semiconductor substrate 10 through the opening portions. Thereby, a p-type body region 16a is formed in the LDMOS transistor formation region, and a p-type body region 16b is formed in the ESD protection element formation region.

Here, by using B (boron) as the p-type impurity, the ions are implanted into the semiconductor substrate 10 under conditions of an implantation energy of 150 keV to 500 keV and a dose of $10^{12}$ cm$^{-2}$ to $3\times10^{13}$ cm$^{-2}$. This ion implantation may be completed by performing one time of ion implantation or two or more times of ion implantations.

In the present embodiment, the body region 16a is formed between the drift region 34a and the element isolation film 11a on one side (the left side in FIG. 10C) in the LDMOS transistor formation region. The body region 16b is formed between the drift region 34b and the element isolation film 11a on one side (the left side in FIG. 10C) in the ESD protection element formation region.

Subsequently, a process performed to obtain a structure in FIG. 10D will be explained. After the formation of the body regions 16a, 16b in the above process, the photoresist film used to form the body regions 16a, 16b is removed. Then, in the same manner as in the first embodiment, a heat treatment at a temperature of 1000° C., for example, is performed to activate the impurities. After the insulating film 13 is removed, the heat treatment is performed again to thermally oxidize the surface of the substrate 10 to form a gate insulating film 17.

After that, gate electrodes 18a, 18b made of a polysilicon, for example, are formed on the gate insulating film 17. In this case, the gate electrode 18a is formed such that one end portion thereof in the width direction overlaps the body region 16a and the other end portion thereof overlaps the element isolation film 11b when the gate electrode 18a is viewed from above. Meanwhile, the gate electrode 18b is formed such that one end portion thereof in the width direction overlaps the body region 16b and the other end portion thereof overlaps the element isolation film 11c when the gate electrode 18b is viewed from above.

Also in the present embodiment, it is important that the overlap length (A2 in FIG. 11) of the gate electrode 18b and the element isolation film 11c is equal to or slightly shorter than the overlap length (A1 in FIG. 11) of the gate electrode 18a and the element isolation film 11b (A1≧A2). In addition, it is also important that the distance (B2 in FIG. 11) between the edge portion of the gate electrode 18b and the edge portion of the element isolation film 11c on the other side is larger than the distance (B1 in FIG. 11) between the edge portion of the gate electrode 18a and the edge portion of the element isolation film 11b on the other side (B1<B2).

Then, a photoresist film is formed on top of the semiconductor substrate 10, and is processed by exposure and development processes thereby to be provided with opening portions at predetermined regions. Thereafter, n-type impurity ions are implanted into the semiconductor substrate 10 through the opening portions to form source regions 19a, 19b and drain regions 20a, 20b.

The source region 19a is formed in an upper portion of the body region 16a at a position adjacent to the gate electrode 18a and away from the element isolation film 11a when viewed from above. Similarly, the source region 19b is formed in an upper portion of the body region 16b at a position adjacent to the gate electrode 18b and away from the element isolation film 11a when viewed from above.

Meanwhile, the drain region 20a is formed between the element isolation film 11b and the element isolation film 11a, and the drain region 20b is formed between the element isolation film 11d and the element isolation film 11a.

After the photoresist film used to form the source regions 19a, 19b and the drain regions 20a, 20b is removed, an insulating film is formed on the enter upper side of the semiconductor substrate 10. The insulating film is processed by anisotropic etching to form side walls 21 on both sides of each of the gate electrodes 18a, 18b. Thereafter, a portion of the gate insulating film 17 not covered with the gate electrodes 18a, 18b and the side walls 21 is removed by etching.

Subsequently, a photoresist film is formed on top of the semiconductor substrate 10 and is processed by exposure and development processes to be provided with opening portions at predetermined regions. After that, p-type impurities are implanted into the semiconductor substrate 10 through the opening portions to form p-type high concentration impurity regions 22a, 22b and an anode region 22c.

In this case, the p-type high concentration impurity region 22a is formed in a surface portion of the body region 16a between the source region 19a and the element isolation film 11a in the LDMOS transistor formation region. Meanwhile, the p-type high concentration impurity region 22b is formed in a surface portion of the body region 16b between the source region 19b and the element isolation film 11a in the ESD protection element formation region. The anode region 22c is formed between the element isolation film 11c and the element isolation film 11d.

After the formation of the p-type high concentration impurity regions 22a, 22b and the anode region 22c, the photoresist film used to form the p-type high concentration impurity regions 22a, 22b and the anode region 22c is removed.

Then, a photoresist film is formed on top of the semiconductor substrate 10, and is processed by exposure and development processes to be provided with opening portions at predetermined regions. Thereafter, n-type impurities are implanted into the semiconductor substrate 10 through the opening portions to form n-type high concentration impurity regions 23a, 23b, 23c, 23d.

In this case, the n-type high concentration impurity region 23a is formed in a surface portion of the source region 19a between the p-type high concentration impurity region 22a and one of the side walls 21, and the n-type high concentration impurity region 23b is formed in a surface portion of the drain region 20a. Meanwhile, the n-type high concentration impurity region 23c is formed in a surface portion of the source region 19b between the p-type high concentration impurity region 22b and one of the side walls 21. The n-type high concentration impurity region 23d is formed in a surface portion of the drain region 20b.

After the formation of the n-type high concentration impurity regions 23a, 23b, 23c, 23d, the photoresist film used to form the n-type high concentration impurity regions 23a, 23b, 23c, 23d is removed and then a heat treatment at a temperature of 1000° C., for example, is performed to activate the impurities. The following silicide film formation process, interlayer insulating film formation process, and conductive plug and interconnection formation process are the same as in the first embodiment, and therefore the description thereof is omitted herein.

Also in the present embodiment, the overlap length A2 of the gate electrode 18b and the element isolation film 11c in the ESD protection element is set equal to or slightly shorter than the overlap length A1 of the gate electrode 18a and the element isolation film 11b in the LDMOS transistor (A1≧A2). In addition, the distance B2 between the edge portion of the gate electrode 18b and the anode region 22c in the ESD protection element is set larger than the distance B1 between the edge portion of the gate electrode 18a and the drain region 20a in the LDMOS transistor (B1<B2).

As is the case with the first embodiment, these settings may enable the ESD protection element to prevent the internal circuit from being broken down due to static electricity or the like, and also allow the semiconductor device to achieve a higher integration. In addition, in the semiconductor device of the present embodiment, the LDMOS transistor and the ESD protection element are formed at the same time, which produces effects of avoiding an increase in the number of manufacturing processes and thereby reducing the manufacturing costs.

Third Embodiment

FIGS. 12A to 12D are cross sectional views illustrating a method of manufacturing a semiconductor device of a third embodiment in the order of manufacturing processes. FIG. 13 is a top view of the semiconductor device of the third embodiment.

To begin with, a p-type silicon semiconductor substrate 10 is prepared as illustrated in FIG. 12A. Then, as is the case with the first embodiment, an element isolation film 11a is formed in the semiconductor substrate 10 to define an LDMOS transistor formation region and an ESD protection element formation region. Also in this process, an element isolation film 11b is formed in the LDMOS transistor formation region and element isolation films 11c, 11d are formed in the ESD protection element formation region. Then, the surface of the semiconductor substrate 10 is thermally oxidized to form an oxide film 13.

Next, a process performed to obtain a structure in FIG. 12B will be explained. After the formation of the oxide film 13 in the above process, a photoresist film (not illustrated) is formed on the oxide film 13. Then, the photoresist film is processed by exposure and development processes to be provided with opening portions at predetermined regions. After that, p-type impurity ions are implanted into the semiconductor substrate 10 through the opening portions.

In this process, the ion implantation is performed by using B (boron) as the p-type impurity under conditions of an implantation energy of 150 keV to 1.0 MeV and a dose of $10^{12}$ $cm^{-2}$ to $3 \times 10^{13}$ $cm^{-2}$. This ion implantation may be completed by performing one time of ion implantation or two or more times of ion implantations.

Thereafter, the photoresist film is removed. In this way, a p-type body region 46a is formed in the LDMOS transistor formation region and a p-type body region 46b is formed in the ESD protection element formation region.

Next, a process performed to obtain a structure in FIG. 12C will be explained. After the formation of the body regions 46a, 46b in the above process, a photoresist film is formed on the oxide film 13, and then is processed by exposure and development processes to be provided with opening portions at predetermined regions. Thereafter, n-type impurity ions are implanted into the body regions 46a, 46b through the opening portions to form an n-type drift region 44a in the LDMOS transistor formation region and an n-type drift region 44b in the ESD protection element formation region.

Figure 12C:
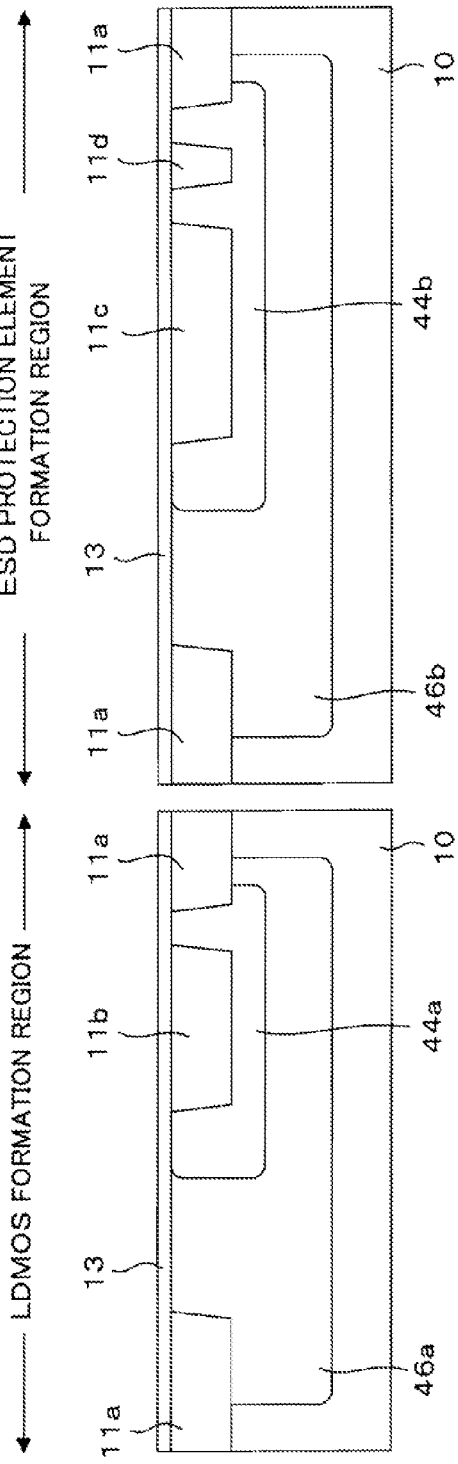
Figure 13:
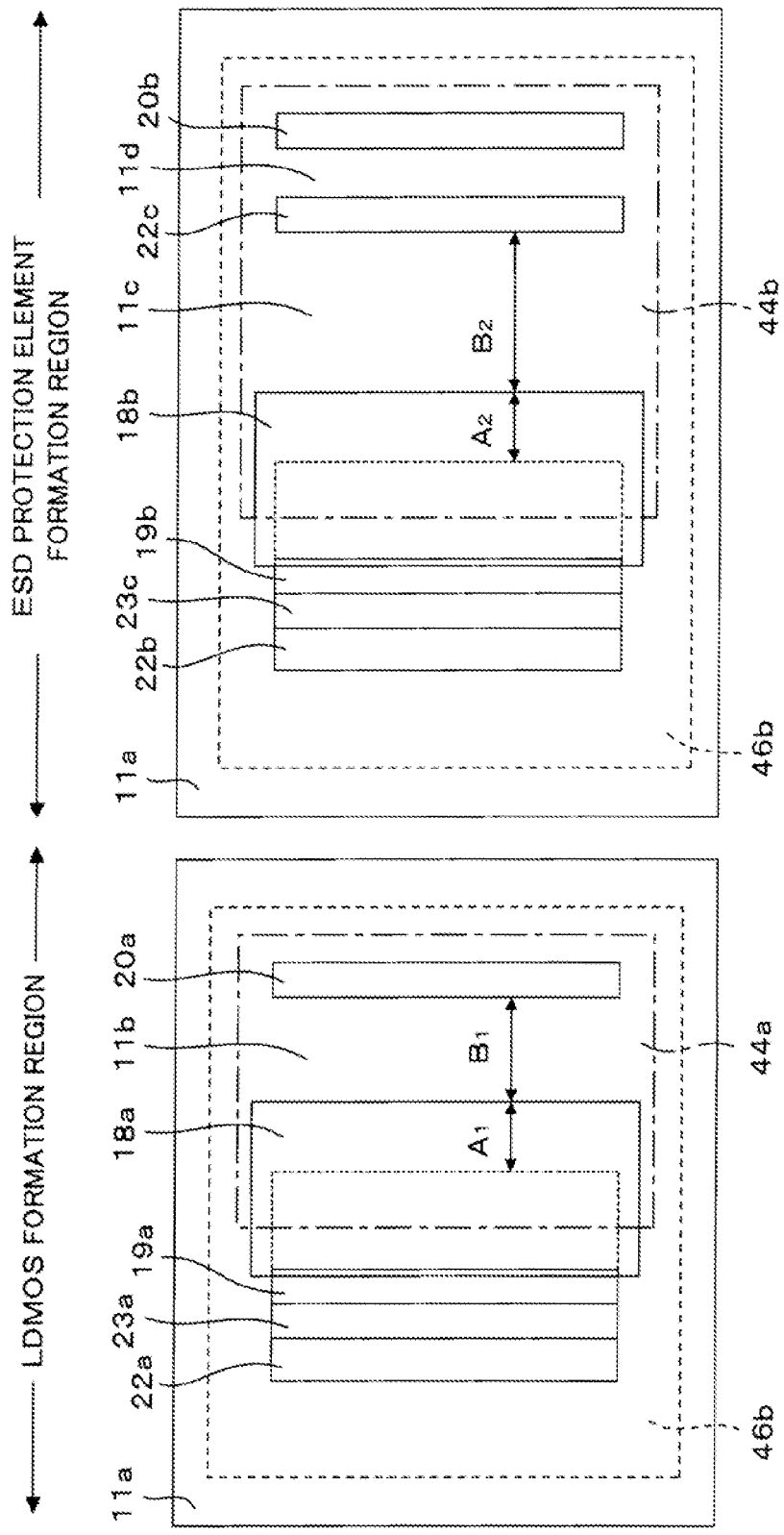
FIG. 13 is a top view of the semiconductor device of the third embodiment.

As illustrated in FIG. 12C, the drift region 44a in the LDMOS transistor formation region surrounds the element isolation film 11b, and is away from the element isolation film 11a on one side (the left side in FIG. 12C) but is in contact with the element isolation film 11a on the other side (the right side in FIG. 12C). In addition, as illustrated in FIG. 12C, the drift region 44b in the ESD protection element formation region surrounds the element isolation films 11c, 11d, and is away from the element isolation film 11a on one side (the left side in FIG. 12C) but is in contact with the element isolation film 11a on the other side (the right side in FIG. 12C).

Figure 12D:
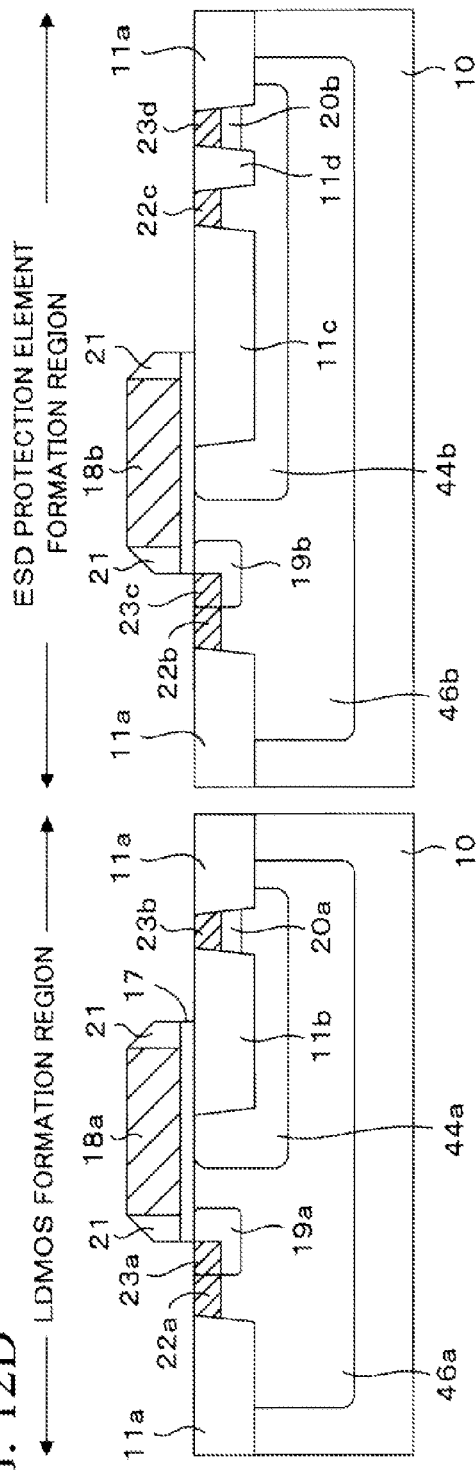

Next, a process performed to obtain a structure in FIG. 12D will be explained. After the formation of the drift regions 44a, 44b in the above process, the photoresist film used to form the drift regions 44a, 44b is removed. Then, as is the case with the first embodiment, a heat treatment at a temperature of 1000° C., for example, is performed to activate the impurities. Then, the insulating film 13 is removed, and the heat treatment is performed again to thermally oxidize the surface of the substrate 10, and thereby to form a gate insulating film 17.

Subsequently, gate electrodes 18a, 18b made of a polysilicon, for example, are formed on the gate insulating film 17. In this case, the gate electrode 18a is formed such that one end portion thereof in the width direction overlaps the body region 46a and the other end portion thereof overlaps the element isolation film 11b when the gate electrode 18a is viewed from above. Meanwhile, the gate electrode 18b is formed such that one end portion thereof in the width direction overlaps the body region 46b and the other end portion thereof overlaps the element isolation film 11c when the gate electrode 18b is viewed from above.

Also in the present embodiment, it is important that the overlap length (A2 in FIG. 13) of the gate electrode 18b and the element isolation film 11c is equal to or slightly shorter than the overlap length (A1 in FIG. 13) of the gate electrode 18a and the element isolation film 11b (A1≧A2). In addition, it is also important that the distance (B2 in FIG. 13) between the edge portion of the gate electrode 18b and the edge portion of the element isolation film 11c on the other side is larger than the distance (B1 in FIG. 13) between the edge portion of the gate electrode 18a and the edge portion of the element isolation film 11b on the other side (B1<B2).

Then, a photoresist film is formed on top of the semiconductor substrate 10 and is processed by exposure and development processes to be provided with opening portions at predetermined regions. Thereafter, n-type impurity ions are implanted into the semiconductor substrate 10 through the opening portions to form source regions 19a, 19b and drain regions 20a, 20b.

The source region 19a is formed in an upper portion of the body region 46a at a position adjacent to the gate electrode 18a and away from the element isolation film 11a when viewed from above. Similarly, the source region 19b is formed in an upper portion of the body region 46b at a position adjacent to the gate electrode 18b and away from the element isolation film 11a when viewed from above.

Meanwhile, the drain region 20a is formed between the element isolation film 11b and the element isolation film 11a, and the drain region 20b is formed between the element isolation film 11d and the element isolation film 11a.

After the photoresist film used to form the source regions 19a, 19b and the drain regions 20a, 20b is removed, an insulating film is formed on the enter upper side of the semiconductor substrate 10. The insulating film is processed by anisotropic etching to form side walls 21 on both sides of each of the gate electrodes 18a, 18b. Thereafter, a portion of the gate insulating film 17 not covered with the gate electrodes 18a, 18b and the side walls 21 is removed by etching.

Subsequently, a photoresist film is formed on top of the semiconductor substrate 10 and is processed by exposure and development processes to be provided with opening portions at predetermined regions. After that, p-type impurities are implanted into the semiconductor substrate 10 through the opening portions to form p-type high concentration impurity regions 22a, 22b and an anode region 22c.

In this case, the p-type high concentration impurity region 22a is formed in a surface portion of the body region 46a between the source region 19a and the element isolation film 11a in the LDMOS transistor formation region. Meanwhile, the p-type high concentration impurity region 22b is formed in a surface portion of the body region 46b between the source region 19b and the element isolation film 11a in the ESD protection element formation region. The anode region 22c is formed between the element isolation film 11c and the element isolation film 11d.

Then, a photoresist film is formed on top of the semiconductor substrate 10 and is processed by exposure and development processes to be provided with opening portions at predetermined regions. Then, n-type impurities are implanted into the semiconductor substrate 10 through the opening portions to form n-type high concentration impurity regions 23a, 23b, 23c, 23d.

In this case, the n-type high concentration impurity region 23a is formed in a surface portion of the source region 19a between the p-type high concentration impurity region 22a and one of the side walls 21, and the n-type high concentration impurity region 23b is formed in a surface portion of the drain region 20a. Meanwhile, the n-type high concentration impurity region 23c is formed in a surface portion of the source region 19b between the p-type high concentration impurity region 22b and one of the side walls 21. The n-type high concentration impurity region 23d is formed in a surface portion of the drain region 20b.

After the formation of the n-type high concentration impurity regions 23a, 23b, 23c, 23d, the photoresist film used to form the n-type high concentration impurity regions 23a, 23b, 23c, 23d is removed and then a heat treatment at a temperature of 1000° C., for example, is performed to activate the impurities. Following silicide film formation process, interlayer insulating film formation process, and conductive plug and interconnection formation process are the same as in the first embodiment, and therefore the description thereof is omitted herein.

Also in the present embodiment, the overlap length A2 of the gate electrode 18b and the element isolation film 11c in the ESD protection element is set equal to or slightly shorter than the overlap length A1 of the gate electrode 18a and the element isolation film 11b in the LDMOS transistor (A1≧A2). In addition, the distance B2 between the edge portion of the gate electrode 18b and the anode region 22c in the ESD protection element is set larger than the distance B1 between the edge portion of the gate electrode 18a and the drain region 20a in the LDMOS transistor (B1<B2).

As is the case with the first embodiment, these settings may enable the ESD protection element to prevent the internal circuit from being broken down due to static electricity or the like, and also allow the semiconductor device to achieve a higher integration. In addition, in the semiconductor device of the present embodiment, the LDMOS transistor and the ESD protection element are formed at the same time, which produces effects of avoiding an increase in the number of manufacturing processes and thereby reducing the manufacturing costs.

Fourth Embodiment

Figure 14:
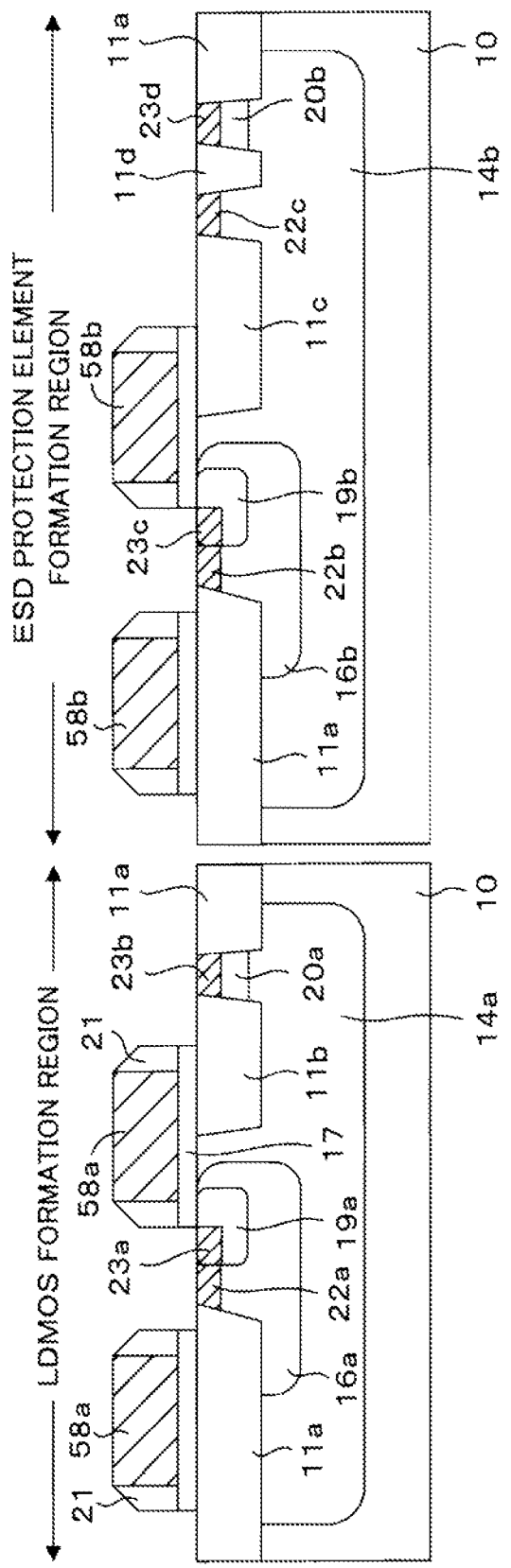
FIG. 14 is a cross sectional view of a semiconductor device according to a fourth embodiment.

FIG. 14 is a cross sectional view illustrating a semiconductor device according to a fourth embodiment. FIG. 15 is a top view of the semiconductor device of the fourth embodiment. In FIGS. 14 and 15, the same reference numerals are attached to the same portions as those in FIGS. 1 and 2, and the detailed description thereof is omitted. Incidentally, the illustrations of the silicide film, the interlayer insulating film and the like are omitted in FIGS. 14 and 15.

In a semiconductor substrate 10, an element isolation film 11a is formed as in the case of the first embodiment, and thereby an LDMOS transistor formation region and an ESD protection element formation region are defined by the element isolation film 11a. In addition, an element isolation film 11b is formed in the LDMOS transistor formation region and element isolation films 11c, 11d are formed in the ESD protection element formation region.

Moreover, an n-type drift region 14a, a p-type body region 16a, an n-type source region 19a, an n-type drain region 20a, a p-type high concentration impurity region 22a, and n-type high concentration impurity regions 23a, 23b are formed in the LDMOS transistor formation region. Meanwhile, an n-type drift region 14b, a p-type body region 16b, an n-type source region 19b, a p-type anode region 22c, an n-type drain region 20b, a p-type high concentration impurity region 22b, and n-type high concentration impurity regions 23c, 23d are formed in the ESD protection element formation region.

In the LDMOS transistor formation region, a gate electrode 58a in a rectangular ring shape is formed on the semiconductor substrate 10 with the gate insulating film 17 interposed in between. As illustrated in FIG. 15, the p-type high concentration impurity region 22a and the n-type high concentration impurity region 23a are disposed inside the gate electrode 58a in the ring shape.

Similarly, in the ESD protection element formation region, a gate electrode 58b in a rectangular ring shape is formed on the semiconductor substrate 10 with the gate insulating film 17 interposed in between. As illustrated in FIG. 15, the p-type high concentration impurity region 22b and the n-type high concentration impurity region 23c are disposed inside the gate electrode 58b in the ring shape.

Also in the present embodiment, the overlap length (A2 in FIG. 15) of the gate electrode 58b and the element isolation film 11c is set equal to or slightly shorter than the overlap length (A1 in FIG. 15) of the gate electrode 58a and the element isolation film 11b (A1≧A2). In addition, the distance (B2 in FIG. 15) between the edge portion of the gate electrode 58b and the edge portion of the element isolation film 11c on the other side is set larger than the distance (B1 in FIG. 15) between the edge portion of the gate electrode 18a and the edge portion of the element isolation film 11b on the other side (B1<B2).

As is the case with the first embodiment, these settings may enable the ESD protection element to prevent the internal circuit from being broken down due to static electricity or the like, and also allow the semiconductor device to achieve a higher integration. In addition, in the semiconductor device of the present embodiment, the LDMOS transistor and the ESD protection element are formed at the same time, which produces effects of avoiding an increase in the number of manufacturing processes and thereby reducing the manufacturing costs.

Moreover, in the present embodiment, the gate electrodes 58a, 58b are formed in the ring shapes. Due to the bias of the gate electrodes 58a, 58b, the depletion layers expand in the drift regions 14a, 14b with relatively higher concentration. This produces an advantageous effect of obtaining the desired characteristic (junction breakdown voltage) of the semiconductor device.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device comprising:
  a laterally diffused metal oxide semiconductor (LDMOS) transistor; and
  an electrostatic discharge (ESD) protection element, wherein
  the LDMOS transistor comprises:
    a first gate electrode formed on the semiconductor substrate with an insulating film interposed therebetween;
    a first body region formed by implanting impurities of a first conductivity type into the semiconductor substrate and disposed at one edge side of the first gate electrode;
    a first source region of a second conductivity type disposed in an upper portion of the first body region;
    a first element isolation film formed in an upper portion of the semiconductor substrate and disposed to overlap the first gate electrode;

a first drain region formed inside the semiconductor substrate, including impurities of the second conductivity type, and disposed at a position in contact with an edge portion of the first element isolation film and away from the first gate electrode; and a first drift region formed inside the semiconductor substrate, including impurities of the second conductivity type, and being in contact with the first body region and the first drain region, and the ESD protection element comprises:

a second gate electrode formed on the semiconductor substrate with an insulating film interposed therebetween;

a second body region formed inside the semiconductor substrate, including impurities of the first conductivity type, and disposed at one edge side of the second gate electrode;

a second source region of the second conductivity type disposed in an upper portion of the second body region;

a second element isolation film formed in an upper portion of the semiconductor substrate and disposed to overlap the second gate electrode;

an anode region formed inside the semiconductor substrate, including impurities of the first conductivity type, and disposed at a position in contact with an edge portion of the second element isolation film and away from the second gate electrode;

a third element isolation film formed in an upper portion of the semiconductor substrate and disposed adjacent to the anode region;

a second drain region formed inside the semiconductor substrate, including impurities of the second conductivity type, and being in contact with the third element isolation film; and a second drift region formed inside the semiconductor substrate, including impurities of the second conductivity type, and being in contact with the second body region, the anode region and the second drain region, wherein the semiconductor device has relationships of $A1 \geq A2$ and $B1<B2$ where A1 denotes an overlap length of the first gate electrode and the first element isolation film; A2 denotes an overlap length of the second gate electrode and the second element isolation film; B1 denotes a distance between the first gate electrode and the first drain region; and B2 denotes a distance between the second gate electrode and the anode region.

2. The semiconductor device according to claim 1, wherein the first element isolation film, the second element isolation film and the third element isolation film are oxide films.

3. The semiconductor device according to claim 1, wherein the first body region is surrounded by the first drift region, and the second body region is surrounded by the second drift region.

4. The semiconductor device according to claim 1, wherein the first body region and the first drift region do not overlap each other in a vertical direction, and the second body region and the second drift region do not overlap each other in the vertical direction.

5. The semiconductor device according to claim 1, wherein the first drift region is surrounded by the first body region, and the second drift region is surrounded by the second body region.

6. The semiconductor device according to claim 1, wherein the first gate electrode and the second gate electrode are each formed in a ring shape.

7. A method of manufacturing a semiconductor device, the method comprising:

defining a laterally diffused metal oxide semiconductor (LDMOS) transistor formation region and an electrostatic discharge (ESD) protection element formation region in a semiconductor substrate of a first conductivity type, and forming a first element isolation film in the LDMOS transistor formation region and forming a second element isolation film and a third element isolation film away from each other in the ESD protection element formation region;

forming a first drift region by implanting impurities of a second conductivity type into the semiconductor substrate in the LDMOS transistor formation region, and forming a second drift region by implanting impurities of the second conductivity type into the semiconductor substrate in the ESD protection element formation region;

forming a first body region at a position away from the first element isolation film by implanting impurities of the first conductivity type into the semiconductor substrate in the LDMOS transistor formation region, and forming a second body region at a position away from the second element isolation film and the third element isolation film by implanting impurities of the first conductivity type into the semiconductor substrate in the ESD protection element formation region;

forming a first gate insulating film on the semiconductor substrate in the LDMOS transistor formation region, and forming a second gate insulating film on the semiconductor substrate in the ESD protection element formation region;

forming a first gate electrode on the first gate insulating film at a position overlapping the first body region and the first element isolation film, and forming a second gate electrode on the second gate insulating film at a position overlapping the second body region and the second element isolation film;

forming a first source region and a first drain region by implanting impurities of the second conductivity type into an upper portion of the first body region in the LDMOS transistor formation region and a portion between the first element isolation film and an edge portion of the LDMOS transistor formation region, and forming a second source region and a second drain region by implanting impurities of the second conductivity type into an upper portion of the second body region in the ESD protection element formation region and a portion between the third element isolation film and an edge portion of the ESD protection element formation region; and forming an anode region by implanting impurities of the first conductivity type into a portion of the ESD protection element formation region between the second element isolation film and the third element isolation film, wherein the first gate electrode, the first element isolation film, the first drain region, the second gate electrode, the second element isolation film and the anode region are formed to satisfy relationships of $A1 \geq A2$ and $B1<B2$ where A1 denotes an overlap length of the first gate electrode and the first element isolation film; A2 denotes an overlap length of the second gate electrode and the second element isolation film; B1 denotes a distance between the first gate electrode and the first drain region; and B2 denotes a distance between the second gate electrode and the anode region.

8. The method of manufacturing a semiconductor device according to claim 7, wherein
the first body region is formed by implanting impurities into an upper portion of the first drift region, and
the second body region is formed by implanting impurities into an upper portion of the second drift region.

9. The method of manufacturing a semiconductor device according to claim 7, wherein
the first body region is formed adjacent to the first drift region, and
the second body region is formed adjacent to the second drift region.

10. The method of manufacturing a semiconductor device according to claim 7, wherein
after the first body region and the second body region are formed, the first drift region and the second drift region are formed by implanting impurities into in an upper portion of the first body region and an upper portion of the second body region.

* * * * *